US006607863B2

(12) United States Patent
Irie

(10) Patent No.: US 6,607,863 B2
(45) Date of Patent: Aug. 19, 2003

(54) EXPOSURE METHOD OF PRODUCTION OF DENSITY FILTER

(75) Inventor: Nobuyuki Irie, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/793,648

(22) Filed: Feb. 27, 2001

(65) Prior Publication Data

US 2001/0018153 A1 Aug. 30, 2001

(30) Foreign Application Priority Data

Feb. 29, 2000 (JP) ........................................ 2000-054962
Jan. 26, 2001 (JP) ........................................ 2001-017797

(51) Int. Cl.$^7$ ................................................ G03F 9/00
(52) U.S. Cl. ............................ 430/30; 430/5; 430/296; 430/942
(58) Field of Search .......................... 430/30, 296, 942, 430/5

(56) References Cited

U.S. PATENT DOCUMENTS 5,831,716 A    11/1998  Tanimoto ................. 355/68
6,104,474 A     8/2000  Suzuki ...................... 355/69
6,162,581 A  * 12/2000  Nakasuji et al. ......... 430/296
6,258,511 B1 *  7/2001  Okino ...................... 430/296
6,295,119 B1    9/2001  Suzuki ...................... 355/53
6,333,138 B1 * 12/2001  Higashikawa et al. ... 430/296
6,411,364 B1    6/2002  Suzuki ...................... 355/53

FOREIGN PATENT DOCUMENTS

WO    WO00/59012    10/2000

* cited by examiner

Primary Examiner—Christopher G. Young
(74) Attorney, Agent, or Firm—Oliff & Berridge PLC

(57) ABSTRACT

A method of exposure while gradually reducing the exposure at peripheral parts when transferring patterns to a plurality of areas on a substrate where the peripheral parts are partially superposed, including exposing one shot area of the substrate through a density filter set so that the energy at the peripheral parts becomes a predetermined first distribution, measuring the distribution of exposure at portions corresponding to the peripheral parts on the substrate, determining a second distribution where the exposure at the peripheral parts becomes a target value based on the measured distribution of exposure, and exposes the shot areas adjoining the one shot area through a density filter set to give the second distribution.

38 Claims, 15 Drawing Sheets

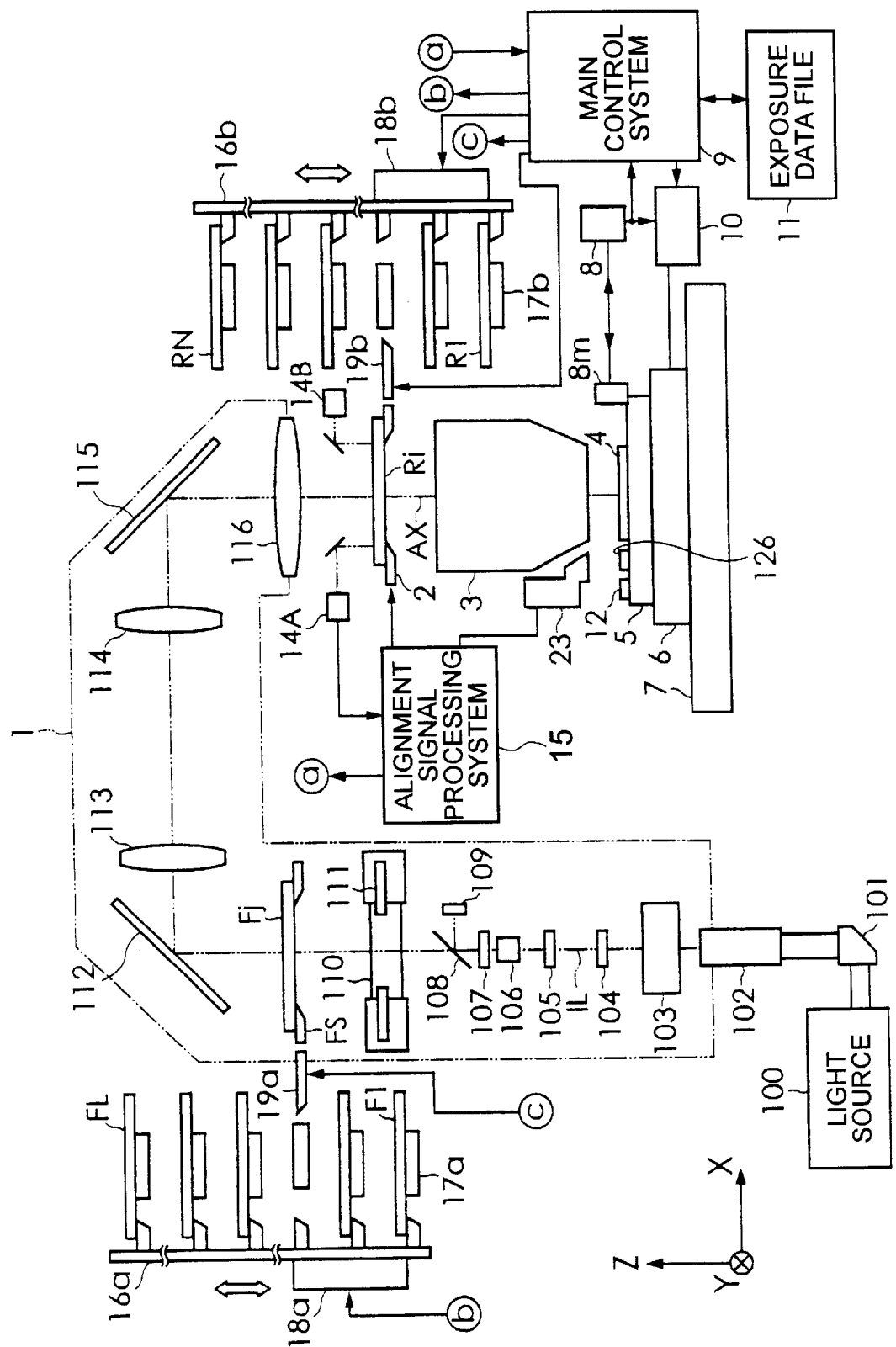

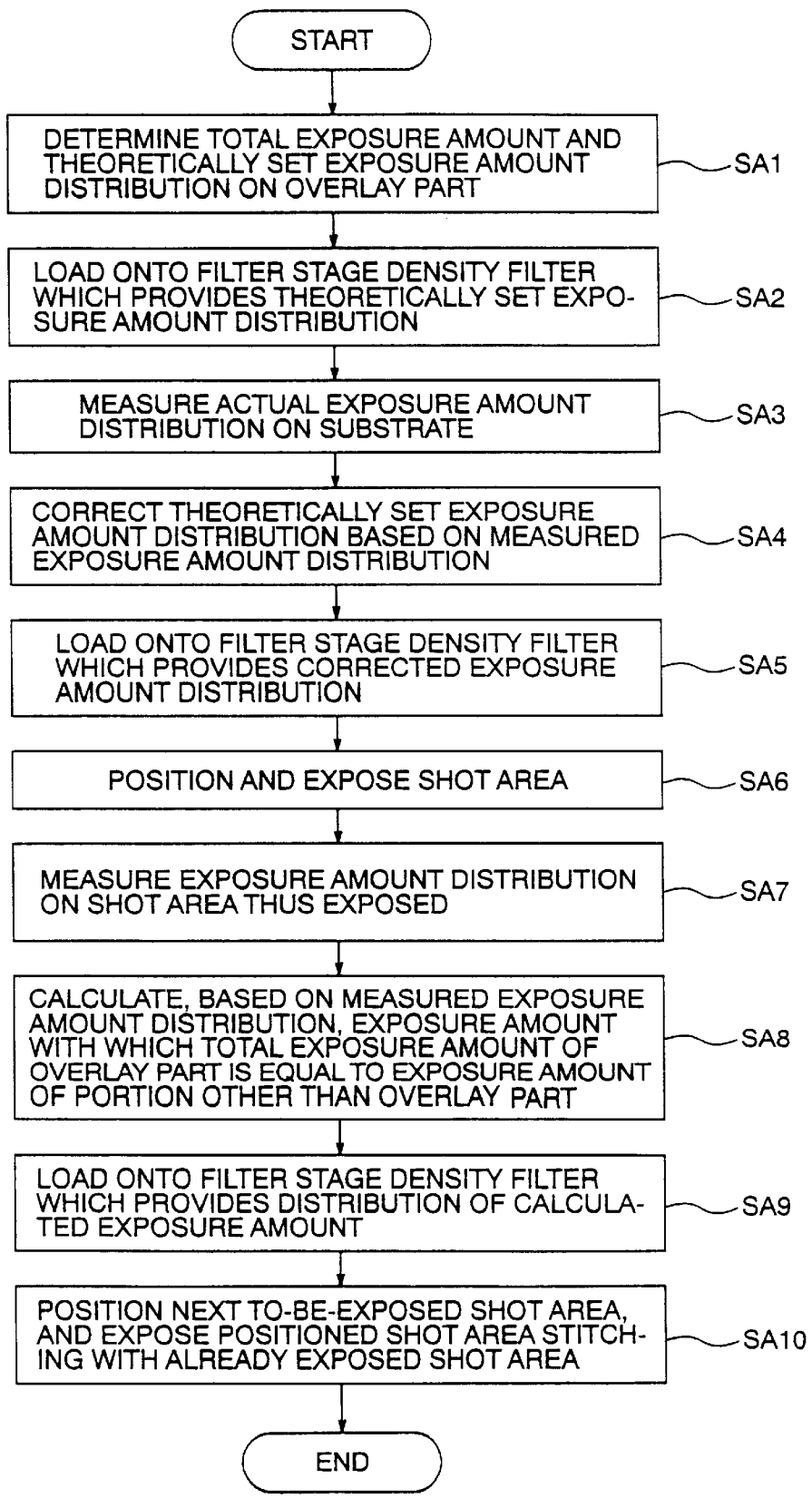

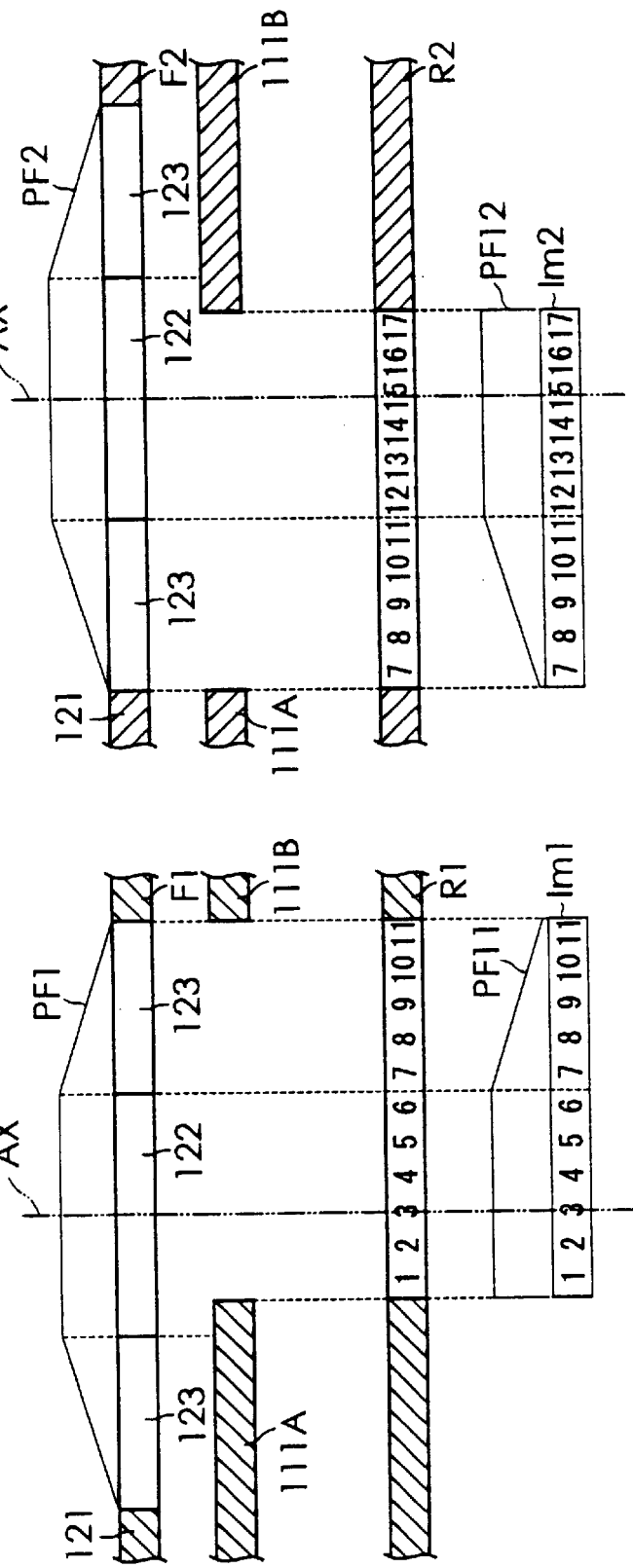

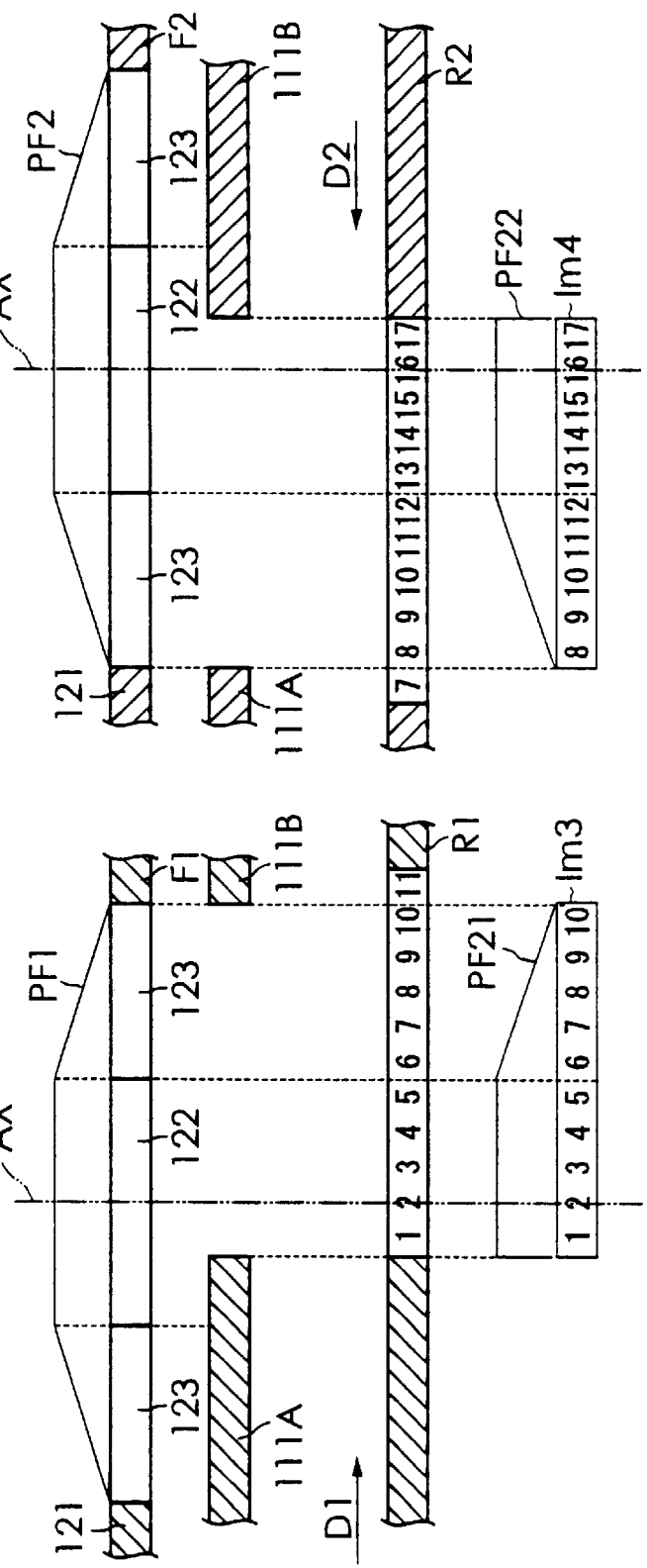
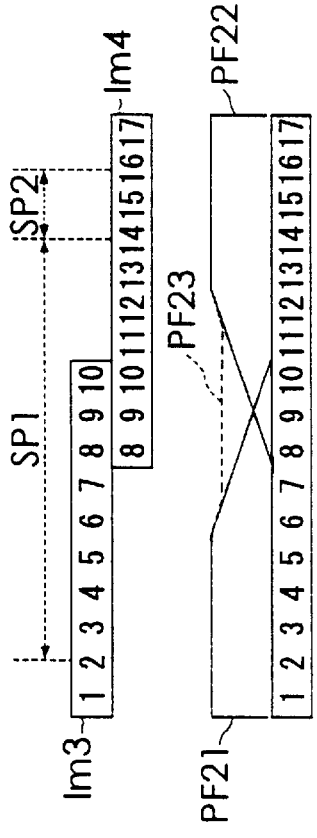

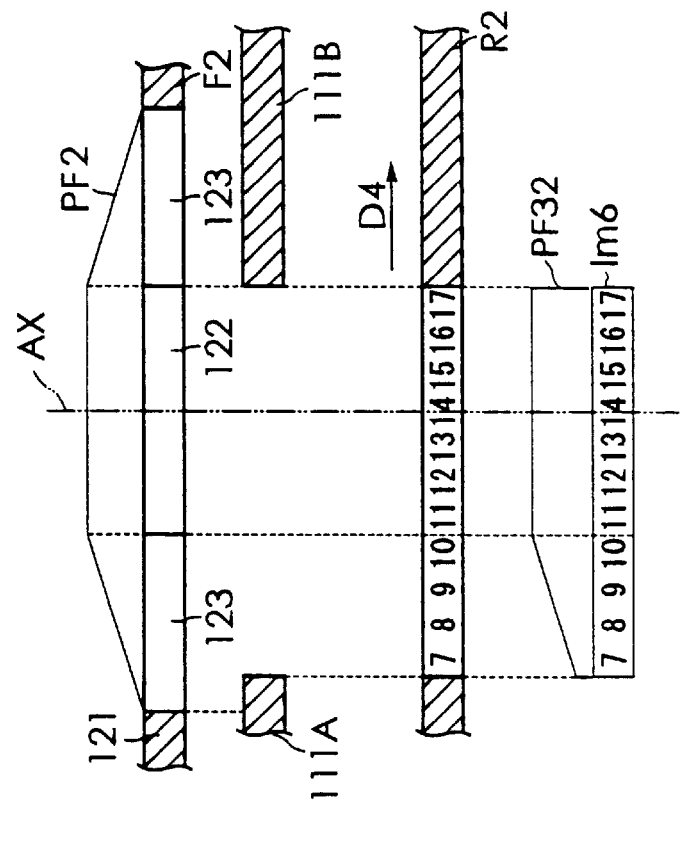
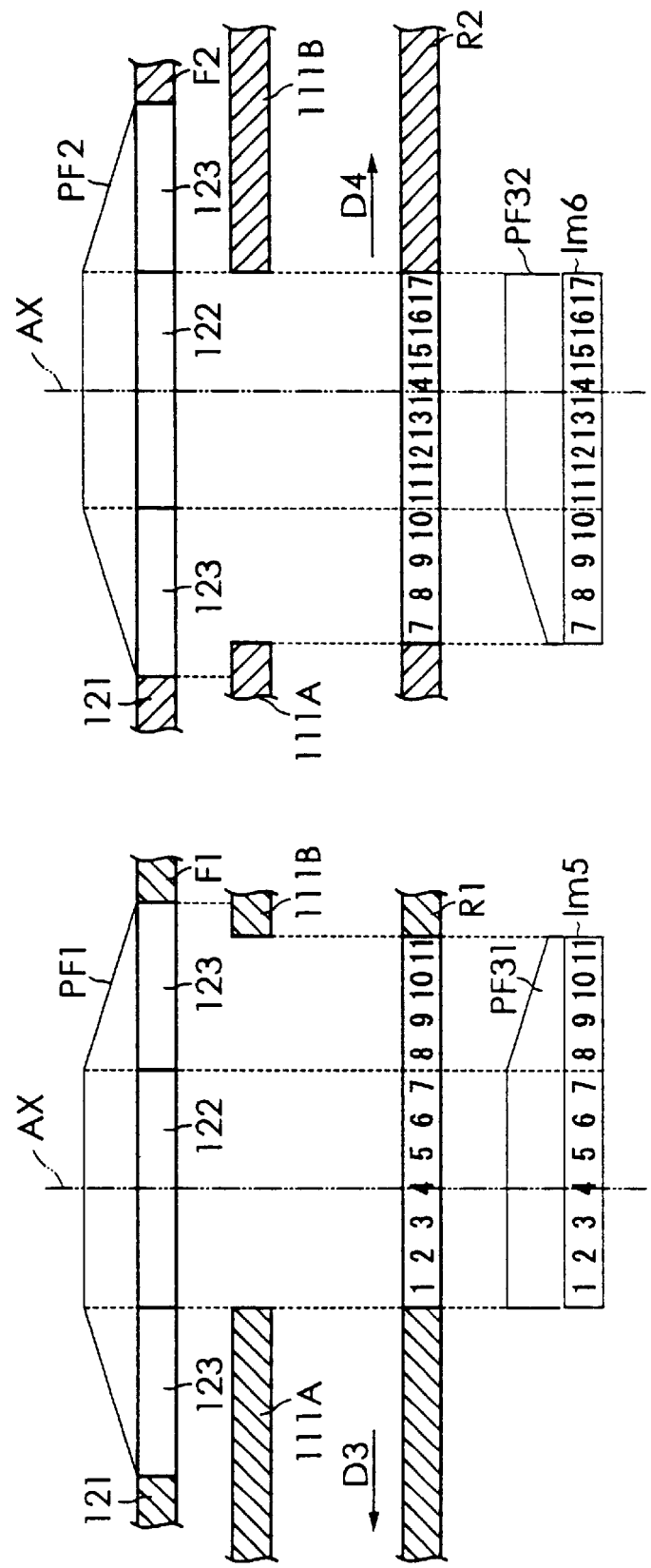
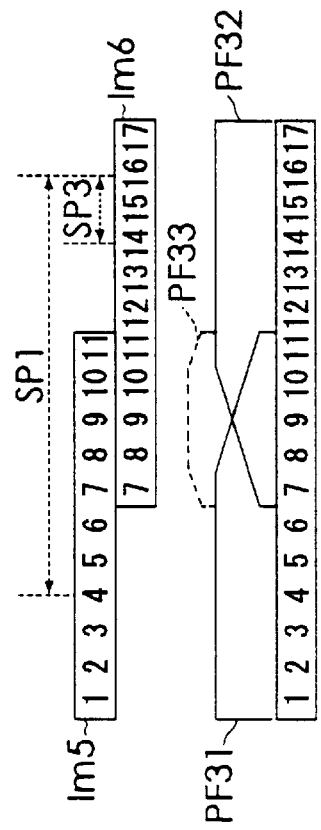

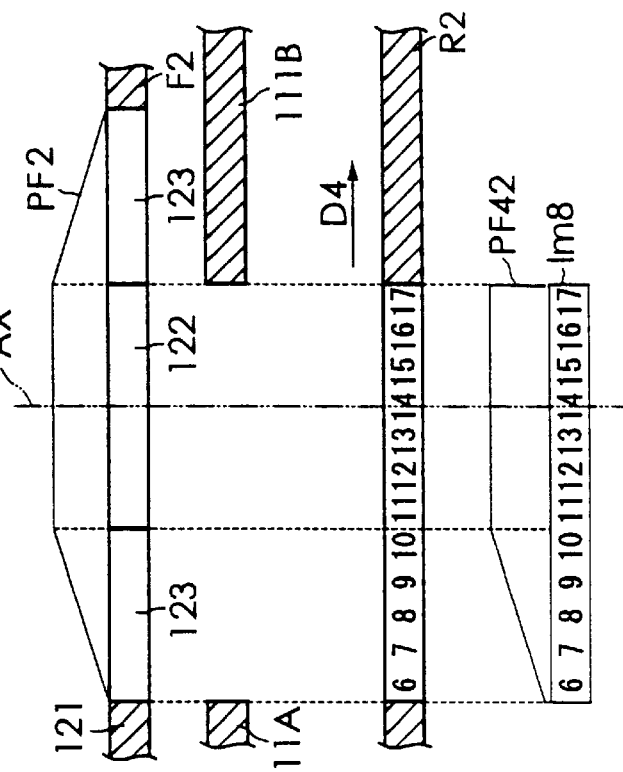
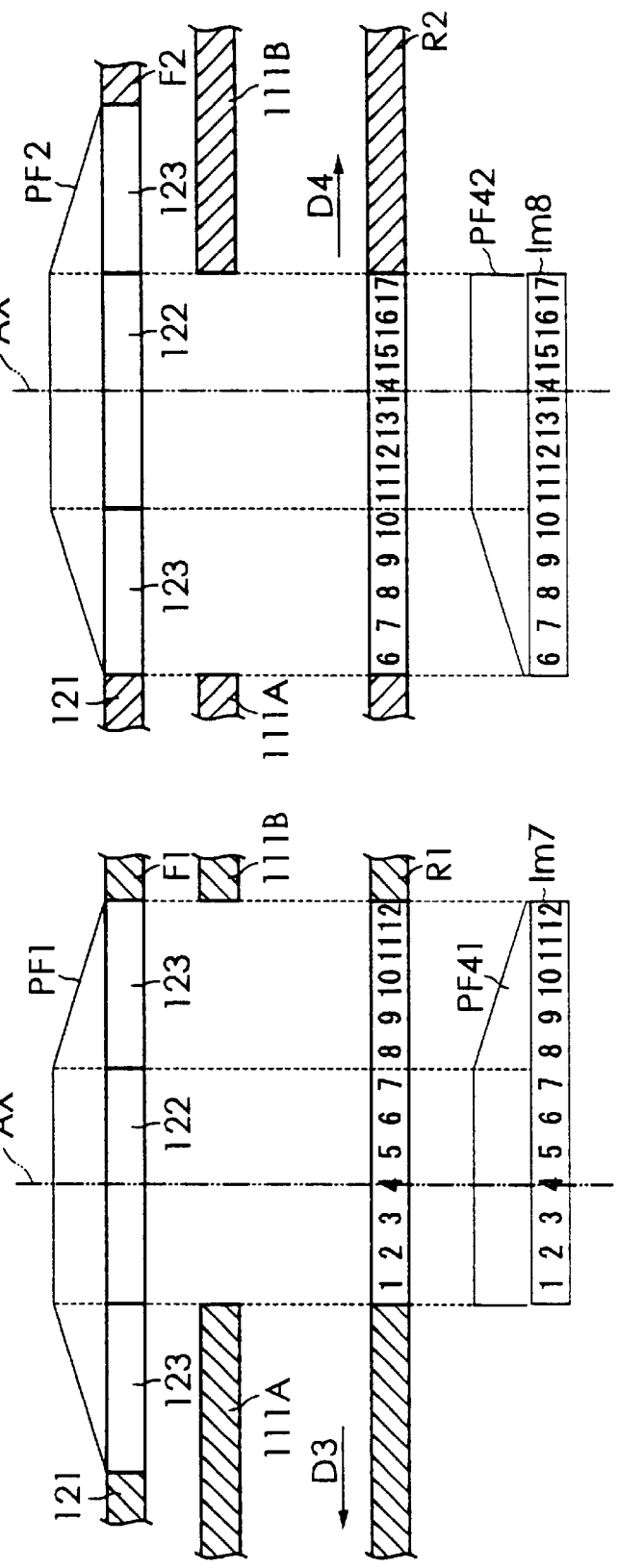
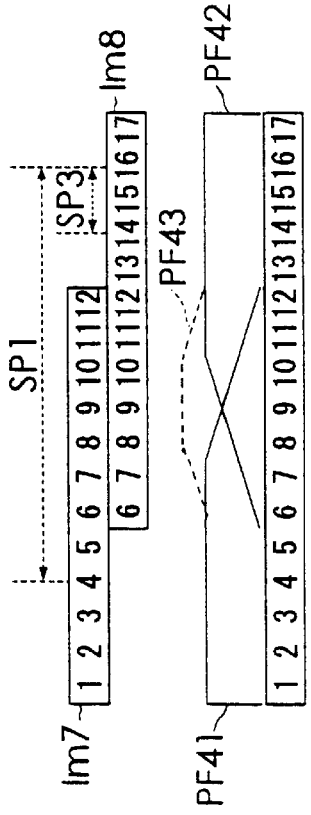

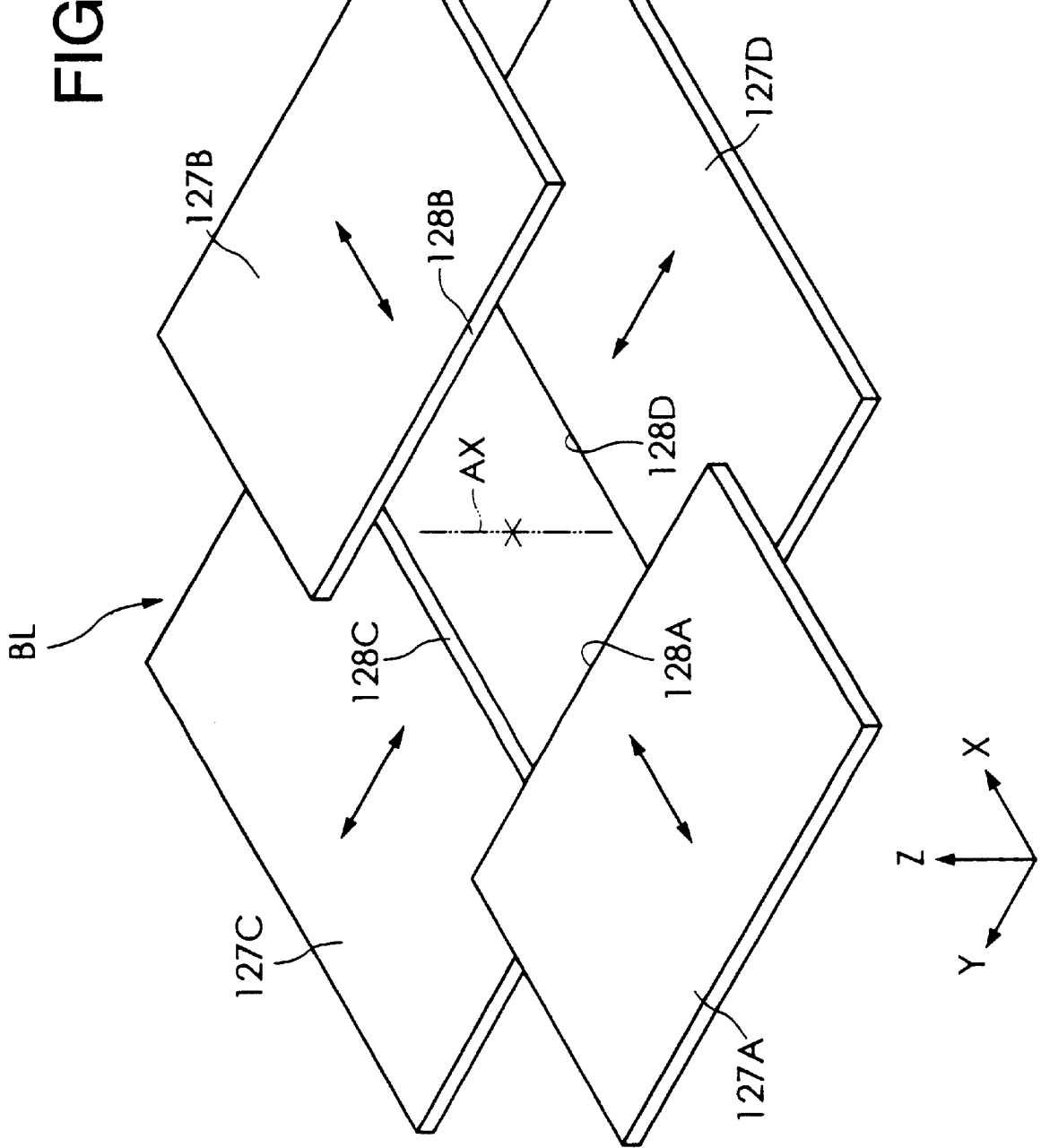

EXPOSURE METHOD OF PRODUCTION OF DENSITY FILTER

BACKGROUND OF THE INVENTION

1. Field of the Invention

The present invention relates to an exposure method and exposure apparatus used when producing a semiconductor integrated circuit, a liquid crystal display element, a thin film magnetic head, or another microdevice or a photomask by photolithography and to a density filter used in such an exposure method and exposure apparatus.

2. Description of the Related Art

In photolithography, one step in the production of a microdevice, use is made of an exposure apparatus for projection exposure of images of patterns of a photomask or reticle on to a substrate for exposure (semiconductor wafer or glass plate coated with a photoresist, light-transparent substrate called a "blank", etc.) In recent years, to deal with the increasingly large size of the exposure area accompanying the increased size of substrates, a stitching type exposure apparatus which partitions the exposure area of the substrate into a plurality of unit areas (hereinafter sometimes referred to as "shots" or "shot areas") and successively projects and exposes images of corresponding patterns on the shots has been developed.

In such an exposure apparatus, there was sometimes misalignment in stitched portions of shots due to aberration of the projection optical system, positioning error of the mask or substrate, etc. Therefore, part of the images of patterns for one shot was superposed over part of the images of the patterns for another shot adjoining it for the exposure. At overlay parts of images of patterns, the exposure becomes greater than portions other than overlay parts, so for example the line width (width of lines or spaces) at overlay parts of patterns formed on the substrate become thinner or thicker in accordance with characteristics of the photoresist.

Therefore, the distribution of exposure at the portions forming overlay parts of the shots is set at an incline so as to become smaller the further toward the outside and the exposure of overlay parts is made equal to the exposure of portions other than overlay parts by two exposures in total so as to prevent a change in line width at these overlay parts.

As art for realizing inclined distribution of exposure at overlay parts of shots, it is known to form light-attenuating parts limiting by an incline the amount of light passing through portions corresponding to overlay parts of the reticle itself. Due to the formation of the light-attenuating parts in the reticle itself, however, the steps and cost of the manufacturing process of the reticle increase and the cost of manufacturing the microdevice etc. increase.

Therefore, an exposure apparatus is being developed which is provided with a density filter formed with a light-attenuating part similar to the above on a glass plate at a position substantially conjugate with the pattern formation surface of the reticle or which is provided with a blind mechanism having a light-blocking plate (blind) able to advance into or retract from the optical path at a position substantially conjugate with the pattern formation surface of the reticle and realizes an inclined distribution of exposure by making the light-blocking plate advance or retract during the exposure processing of the substrate.

In the above exposure apparatus of the related art, however, the density filter used for equalizing the exposure of overlay parts and the exposure of portions other than overlay parts is produced as follows. That is, use is made of an exposure sensor provided on the stage carrying the substrate for measuring the exposure and the exposure sensor is made to move in the substrate plane to measure the distribution of exposure near overlay parts. Further, the angle of inclination of the distribution of the amount of transmitted light (that is, the distribution of the transmittance of the light-attenuating part) at the density filter is set so that the exposure of overlay parts becomes equal to the exposure of portions other than overlay parts based on the results of measurement of the exposure apparatus.

If such a designed density filter is used to limit at an incline the exposure of overlay parts when overlaying and exposing parts of images of patterns, if the exposure is performed by the designed exposure, the exposure at overlay parts and the exposure at portions other than overlay parts will match and the line width of patterns formed at overlay parts will become equal to the line width of patterns formed at portions other than overlay parts. When actually trying to expose patterns, however, the width of the lines at overlay parts becomes thinner and the width of the spaces becomes thicker. This phenomenon is believed to arise due to the following reasons:

First, "flare" arising due to multiple reflections in the projection optical system provided in the exposure apparatus or multiple reflections between the substrate and projection optical system, between the substrate and reticle, and between the reticle and substrate may be considered. That is, when flare occurs, the effect of flare felt at portions other than overlay parts is constant, but since overlay parts are exposed several times, the effect of the flare is received two or four times and therefore the exposure at overlay parts becomes larger than the exposure of portions other than overlay parts. Therefore, as a result, the exposure of overlay parts becomes larger than the exposure of portions other than overlay parts, so the width of the lines becomes thinner and the width of the spaces becomes thicker.

Second, once exposed, a photoresist coated on a substrate has the characteristic of a higher optical transmittance at the exposed portions. Therefore, if overlay parts are exposed two or four times, the amount of light passing through the photoresist and reflected at the surface of the substrate increases, so as a result a greater exposure is performed than the designed exposure. Accordingly, the exposure of overlay parts becomes larger than the exposure of portions other than overlay parts, so the width of the lines becomes thinner and the width of the spaces becomes thicker.

Third, this phenomenon may be due to error in the design of the density filter. As explained above, a density filter used to make the exposure of overlay parts the same as the exposure at other than overlay parts uses an exposure sensor to measure the distribution of exposure near overlay parts and sets the distribution of exposure at an incline to become smaller toward the outside. This exposure sensor is provided with a photoelectric sensor and a slit plate provided on the light receiving surface of the photoelectric sensor. The exposure is measured by measuring by this photoelectric sensor only the exposure light passing through the slits formed in the slit plate. The slit plate is generally comprised of a quartz substrate on which chrome (Cr) is deposited and then patterned. When using these slits, the exposure light is reflected at the slit plate at the time of measurement of the exposure light and the reflected light is reflected at the projection optical system or the reticle resulting in flare. In general, since the reflectance of the chrome surface is higher than the reflectance of the substrate surface coated with the photoresist in the wavelength region of the exposure light, the amount of flare arising when measuring the spatial distribution of exposure using the exposure sensor becomes larger than the amount of flare arising at the time of actual exposure. Therefore, the exposure sensor measures a greater amount of exposure light than at the time of actual exposure and the density filter is prepared based on the result of measurement. Since the thus prepared density filter is not one which actually equalizes the exposure of overlay parts and the exposure at portions other than overlay parts, it is possible that when using this density filter for exposure, the line width of patterns formed at overlay parts and the line width of patterns formed at portions other than overlay parts become different.

Further, when the line width of the patterns of overlay parts is formed different from the line width of portions other than overlay parts, the practice has been not to change the characteristics of the density filter, but to prepare a reticle adjusting the line width of patterns formed at portions corresponding to overlay parts in patterns formed at the reticle for the exposure. That is, to make the line widths of overlay parts and portions other than overlay parts equal, the practice had been to adjust the line width of the patterns of portions corresponding to overlay parts of the reticle without changing the configuration of the exposure apparatus, including the density filter. With this method, however, it was necessary to select the related parts of patterns from the immense reticle data and finely adjust the line widths at those portions. This work was extremely troublesome. Note that the above explanation assumes that the line widths of patterns to be transferred to the substrate are equal at overlay parts and portions other than overlay parts, but when the line widths of patterns are different, even if the line width matches the design value at one of overlay parts and portions other than overlay parts, the line width of the other will differ from the design value and therefore exactly the same problem will occur as above.

SUMMARY OF THE INVENTION

An object of the present invention is to improve the uniformity of line width or pitch of patterns formed on overlay parts where peripheral parts are superposed and portions other than overlay parts when transferring patterns to a plurality of areas where peripheral parts partially overlap on a sensitive object, that is, to make the line width or pitch of patterns substantially match predetermined values at overlay parts and portions other than overlay parts and improve the uniformity or control accuracy of the line width of patterns (transferred images) in individual areas or at the entire surface of the plurality of areas to enable the formation of high accuracy patterns.

Another object of the present invention is to achieve uniform distribution of exposure at individual areas or the entire surface of a plurality of areas when exposing a plurality of areas where peripheral parts are partially superposed on a sensitive object by energy beams or to make the exposures at different points in individual areas or a plurality of areas substantially match corresponding target values so as to improve the control accuracy of exposures at individual areas or the entire surface of a plurality of areas. Still other objects of the present invention will become clear from the following explanation.

According to a first aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising irradiating an energy beam through said setting device set so that the energy at peripheral parts becomes a predetermined first distribution, measuring the distribution of exposure at portions corresponding to the peripheral parts on the sensitive object, and determining a second distribution by which the exposure at the peripheral parts becomes a target amount based on the measured distribution of exposure.

When exposing a plurality of areas where peripheral parts are partially superposed, since the method fires an energy beam by an energy giving a first distribution, measures the distribution of exposure at peripheral parts at that time, and determines a second distribution where the exposure at peripheral parts becomes a target value based on the distribution of exposure obtained by actual measurement, even if there is the effect of flare etc. at the time of exposure, the exposures at overlay parts where the peripheral parts are superposed and portions other than overlay parts can be made substantially equal. Therefore, when transferring patterns with substantially equal line width or pitch at overlay parts and portions other than overlay parts, the uniformity of line width or pitch can be improved between patterns formed at overlay parts and patterns formed at portions other than overlay parts and as a result fine patterns can be formed with good accuracy.

In this case, said first distribution may be set based on a distribution of energy on a predetermined plane at which said sensitive object is arranged, obtained by detecting said energy beam through said setting device, or its integrated value. Further, said first distribution may be set theoretically. Here, "set theoretically" means set geometrically so as to give a linearly inclined distribution of attenuation. This includes such a geometrically set distribution corrected based on known optical characteristics. For example, there are methods correcting the optical characteristics (distortion, image plane curvature, etc.) of an illumination system firing an energy beam on patterns or error due to occurrence of diffracted light exceeding a numerical aperture (NA) of the illumination system from the attenuating part (comprised of dots etc.) of the density filter of the setting device.

When the first distribution is set based on the distribution of energy in a predetermined plane at which said sensitive object is arranged or its integrated value, when the photodetection device for measuring the distribution of exposure is configured by providing a photodetector at a light-blocking plate, the reflectance of the surface of the light-blocking plate may be made substantially the same as the reflectance of the surface of the sensitive object. Further, the size of the light-blocking plate may be made at least about the same degree as an area irradiated by said energy beam. By doing this, when measuring the distribution of energy or its integrated value, it is possible to eliminate the effect of reflection of the light-blocking plate and measure the distribution of energy or its integrated value in a state close to the state where the sensitive object is actually exposed, so it is possible to make the exposure of overlay parts equal to the exposure at other than overlay parts by a higher accuracy.

Note that the photodetector of the photodetection device in the specification of the application should include at least a light receiving surface. Specifically, for example, when providing the photodetector on the substrate stage for substrate movement, all of the components may be provided on the substrate stage, but it is also possible to provide as little as the light receiving surface among the components of the photodetector on the substrate stage and provide the other parts outside the substrate stage.

Further, when the first distribution is set based on the distribution of energy in a predetermined plane where the sensitive object is arranged or its integrated value, if the photodetection device for measuring the distribution of exposure is configured by providing a photodetector at a light-blocking plate, it is possible to detect the detected value of said photodetector based on a value corresponding to error of the detected value of the photodetector arising due to the difference of the reflectance of the surface of the light-blocking plate from the reflectance of the surface of said sensitive object and/or the difference of the size of the light-blocking plate from the area irradiated by the energy beam so as to find said distribution of exposure. According to this, when finding the distribution of exposure, the value is corrected considering the difference of the reflectance and/or size of the light-blocking plate, so it is possible to make the exposure of overlay parts equal to the exposure at other than overlay parts by a higher accuracy even if it is not possible to make the reflectance or size of the light-blocking plate equal to that of the sensitive object.

The second distribution may be determined considering also the change in optical characteristics due to multiple exposure of peripheral parts. The "change in optical characteristics" means for example fluctuation of transmittance of the resist on the substrate due to exposure etc. Further, the setting device may include a density filter having an attenuating part attenuating the energy beam limiting the energy at the peripheral parts to said first distribution. In this case, it is possible to adjust the attenuation characteristic of the attenuating part based on the determined second distribution, and expose each of the plurality of areas by the energy beam through the adjusted density filter. The attenuation characteristic is adjusted by for example exchanging density filters, changing the distribution of transmittance by liquid crystal elements etc., reprocessing the density filter, etc.

Further, in the above method of exposure, it is also possible to multiply expose a sensitive object by said energy beam to measure the distribution of exposure. The sensitive object in this case includes a sensitive object the same as or separate from the "sensitive object" to which the patterns are transferred. Further, "measure the distribution of exposure" in this case includes, in addition to measurement of the distribution of exposure due to an illumination uniformity sensor, compensation for error of exposure arising due to fluctuations in transmittance of the resist due to the multiple exposure.

As said setting device, it is possible to use one including a density filter having an attenuating part gradually reducing the energy of the energy beam. In this case, it is possible to change the position of the density filter with respect to a mask on which the patterns to be transferred are formed to change the width of a second overlay part where an image of the attenuating part is superposed based on the determined second distribution without changing a width of a first overlay part where peripheral parts are superposed and thereby adjust the exposure of the first overlay part. The adjustment of the exposure of the first overlay part includes the case of just changing the position of the density filter without switching it and the case of both switching the density filter and changing its position. When adjusting exposure by both switching the density filter and changing the position, it is possible to use a density filter set based on a second distribution where the attenuation characteristic is determined. As one example, it is possible to set the attenuation characteristic of the density filter based on the distribution of exposure obtained by detection of the energy beam by the photodetector and change the position of the density filter to cancel the error of exposure remaining even when using this density filter (for example, arising due to fluctuation of optical characteristics of the resist due to multiple exposure). Further, it is possible to change the distribution of the energy beam limited by said density filter and the relative position with the patterns to be transferred so as to adjust the exposure at overlay parts where peripheral parts are superposed. In this case, it is possible to use patterns obtained by enlarging the patterns to be transferred in the direction of overlay parts (stitching direction). By doing this, it is possible to easily adjust the exposure of overlay parts by just changing the relative positions of the mask and density filter. Further, since only the relative positions of the mask and density filter are changed, no time is required for processing and as a result the throughput can be improved.

Further, when using a setting device including a density filter having an attenuating part gradually reducing the energy of the energy beam, by changing the optical characteristics of an optical system from said density filter to a mask where the patterns to be transferred are formed to change the width of a second overlay part where an image of the attenuating part is superposed based on the determined second distribution without changing a width of a first overlay part where peripheral parts are superposed, it is possible to adjust the exposure of the first overlay part. The adjustment of the exposure of the first overlay part includes the case of just changing the optical characteristics of the optical system without switching the density filter and the case of both switching the density filter and changing the optical characteristics of the optical system. When adjusting the exposure by both switching the density filter and changing the optical characteristics of the optical system, it is possible to use a density filter set based on a second distribution where the attenuation characteristic is determined. As one example, it is possible to set the attenuation characteristic of the density filter based on the distribution of exposure obtained by detection of the energy beam by the photodetector and cancel the error of the exposure remaining even when using this density filter (for example, arising due to fluctuation of the optical characteristics of the resist due to multiple exposure) by changing the position of the density filter.

Further, it is possible to change the optical characteristics (for example, the magnification) of the optical system from the density filter to the patterns to be transferred to change the distribution of the energy beam limited by said density filter and the relative position with the patterns to be transferred so as to adjust the exposure at overlay parts where peripheral parts are superposed. By doing this, it is possible to easily adjust the exposure of overlay parts by just changing the magnification of the optical system. Further, since no time is required for adjusting the optical system (changing the magnification etc.), the throughput can be improved.

Further, in the specification of the present application, the "image of the attenuating part" in the description "change the width of a second overlay part where an image of the attenuating part is superposed" means the image of the attenuating part in the case where there is no light-blocking object (for example, blind, light-blocking band of mask, etc.) interposed in the optical path of the exposure light.

According to a second aspect of the present invention, there is provided a exposure method for transferring patterns to a plurality of areas where peripheral parts are partially superposed on a sensitive object by exposing each of the areas by an energy beam through a setting device gradually reducing exposure at the peripheral parts, comprising irradiating an energy beam through said setting device and making the reflectance of the surface of a light-blocking plate of a photodetection device having a photodetector and said light-blocking plate used for measuring the distribution of exposure at portions corresponding to peripheral parts on the sensitive object substantially the same as the reflectance of the surface of said sensitive object. In this case, the exposure at the peripheral parts may be set based on said measured distribution of exposure and a change in optical characteristics due to multiple exposure of peripheral parts.

According to a third aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising irradiating an energy beam through said setting device and making a size of a light-blocking plate of a photodetection device having a photodetector and said light-blocking plate used for measuring the distribution of exposure at portions corresponding to peripheral parts on the sensitive object substantially the same as an area irradiated by said energy beam. In this case, the exposure at the peripheral parts may be set based on said measured distribution of exposure and a change in optical characteristics due to multiple exposure of peripheral parts.

According to a fourth aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising irradiating an energy beam through said setting device, detecting said energy beam by a photodetection device having a photodetector and light-blocking plate used for measuring a distribution of exposure at portions corresponding to the peripheral parts on said sensitive object, and setting the exposure at said peripheral parts based on information relating to the difference between the reflectance at said light-blocking plate and the reflectance of said sensitive object and the results of detection. In this case, it is possible to correct the detected value of said photodetector based on said difference of the reflectances to find the distribution of exposure. At this time, preferably the exposure is set considering the change in optical characteristics due to multiple exposure of peripheral parts.

According to a fifth aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising irradiating an energy beam through said setting device, detecting said energy beam by a photodetection device having a photodetector and light-blocking plate used for measuring a distribution of exposure at portions corresponding to the peripheral parts on said sensitive object, and setting the exposure at said peripheral parts based on information relating to the difference between the size of said light-blocking plate and the area irradiated by said energy beam. At this time, preferably the exposure is set considering the change in the optical characteristics due to multiple exposure of peripheral parts.

According to a sixth aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising performing test exposure of a test sensitive object by said energy beam through said setting device set so that the exposure at the peripheral parts has a predetermined first distribution, measuring the shapes of images of patterns of an overlay part, formed on said test sensitive object, where peripheral parts are superposed, determining a second distribution so that the shapes of images of patterns measured become target values, and performing main exposure by setting the setting device to obtain the determined second distribution.

According to a seventh aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising providing said setting device with a density filter having an attenuating part gradually reducing the energy of the energy beam and changing the position of the density filter with respect to the patterns to be transferred to change the width of a second overlay part where the image of the attenuating part is superposed without changing the width of a first overlay part where the peripheral parts are superposed so as to adjust the exposure of said first overlay part. In this case, it is possible to further use patterns obtained by enlarging the patterns to be transferred in the direction of the overlay part. Further, it is possible to set the width of the first overlay part larger than the width of the attenuating part of the density filter.

According to an eighth aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising providing said setting device with a density filter having an attenuating part gradually reducing the energy of the energy beam and changing the distribution of the energy beam limited by the density filter and the relative position with the patterns to be transferred so as to adjust the exposure at an overlay part where the peripheral parts are superposed. In this case, it is possible to use patterns obtained by enlarging the patterns to be transferred in the direction of the overlay parts.

According to a ninth aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising providing said setting device with a density filter having an attenuating part gradually reducing the energy of the energy beam and changing the optical characteristics (for example, the magnification) of an optical system from said density filter to patterns to be transferred to change the width of a second overlay part where an image of said attenuating part is superposed without changing the width of a first overlay part where the peripheral parts are superposed so as to adjust the exposure of said first overlay part.

According to a 10th aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising providing said setting device with a density filter having an attenuating part gradually reducing the energy of the energy beam and changing the optical characteristics of an optical system from said density filter to patterns to be transferred to change the distribution of the energy beam limited by said density filter and the relative position with the patterns to be transferred so as to adjust the exposure at overlay parts where the peripheral parts are superposed.

According to an 11th aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising providing said setting device with a plurality of density filters having different attenuating characteristics of attenuating parts gradually reducing the energy of the energy beam and switching the density filters to adjust the exposure at overlay parts where peripheral parts are superposed.

According to an 12th aspect of the present invention, there is provided an exposure method for transferring patterns to a plurality of areas where peripheral parts are partially superposed on a sensitive object by exposing each of the areas by an energy beam through a setting device gradually reducing exposure at the peripheral parts, comprising setting the exposure of peripheral parts based on a change in optical characteristics due to multiple exposure of peripheral parts.

In the methods of exposure according to the first to 12th aspects of the present invention, it is possible to partition a pattern obtained by enlarging a transfer pattern into a plurality of parent patterns and transfer an image of each of the parent patterns reduced by a projection optical system to a plurality of areas where peripheral parts are partially superposed on a sensitive object by exposing each area by an energy beam through a setting device gradually reducing the exposure at the peripheral parts.

According to an 13th aspect of the present invention, there is provided a photomask produced using the methods of exposure according to the first to 12th aspects of the present invention. Since the exposure of overlay parts is adjusted at a high accuracy, the difference between the patterns formed at overlay parts and the patterns formed at portions other than overlay parts when forming patterns having equal line widths at overlay parts and portions other than overlay parts becomes smaller and it is possible to produce an extremely fine, large area photomask.

According to a 14th aspect of the present invention, there is provided a method of production of a density filter used in an exposure apparatus transferring patterns to a plurality of areas where peripheral parts are partially superposed on a sensitive object by exposing each area by an energy beam through a density filter having an attenuating part gradually reducing the exposure at the peripheral parts, comprising exposing a sensitive object by an energy beam through a test density filter having an attenuating part set so that the exposure at said peripheral parts has a predetermined first distribution, measuring the distribution of exposure at portions corresponding to the peripheral parts on said sensitive object, determining a second distribution where the exposure at the peripheral parts becomes a target value based on the measured distribution of exposure, and forming said attenuating part so as to give said determined second distribution. In this case, the attenuating characteristic of an attenuating part of said density filter may be set by adjusting the distribution of density of light-blocking dots formed on the surface of a transparent substrate forming said density filter.

According to a 15th aspect of the present invention, there is provided a method of production of a density filter used in an exposure apparatus transferring patterns to a plurality of areas where peripheral parts are partially superposed on a sensitive object by exposing each area by an energy beam through a density filter having an attenuating part gradually reducing the exposure at the peripheral parts, comprising exposing a test sensitive object by an energy beam through a density filter having an attenuating part set so that the exposure at said peripheral parts has a predetermined first distribution, measuring the shape of images of patterns of peripheral parts formed on said test sensitive object where said peripheral parts are superposed, determining a second distribution where the measured shapes of the images of the patterns become target values, and forming said attenuating part so as to give said determining second distribution. In this case, the attenuating characteristic of an attenuating part of said density filter may be set by adjusting the distribution of density of light-blocking dots formed on the surface of a transparent substrate forming said density filter.

According to a 16th aspect of the present invention, there is provided an exposure apparatus provided with a density filter produced using the method of production of the density filter according to the 14th aspect or 15th aspect of the present invention.

According to a 17th aspect of the present invention, there is provided a method of production of an exposure apparatus exposing by an energy beam each of a plurality of areas where peripheral parts are partially superposed on a sensitive object, comprising firing said energy beam through a density filter gradually reducing the exposure at peripheral parts, measuring the distribution of exposure at portions corresponding to the peripheral parts on said sensitive object, and preparing a density filter formed with an attenuating part of said energy beam so that the distribution of exposure becomes a target value at said peripheral parts based on the measured distribution of exposure and information relating to the attenuation characteristic of said density filter. In this case, the former density filter (density filter on which energy beam is fired) and latter density filter (density filter produced) may be the same or different.

According to an 18th aspect of the present invention, there is provided a method of production of an exposure apparatus exposing by an energy beam each of a plurality of areas where peripheral parts are partially superposed on a sensitive object, comprising firing said energy beam through a density filter gradually reducing the exposure at said peripheral parts, detecting said energy beam by a photodetection device having a photodetector and light-blocking plate used for measurement of the distribution of exposure at portions corresponding to said peripheral parts on said sensitive object, and preparing a density filter formed with an attenuating part of said energy beam so that the distribution of exposure becomes a target value at said peripheral parts based on information relating to the difference between a reflectance of said light-blocking plate and a reflectance of said sensitive object, information relating to an attenuating characteristic of said density filter, and the result of said detection.

According to a 19th aspect of the present invention, there is provided a method of production of an exposure apparatus exposing by an energy beam each of a plurality of areas where peripheral parts are partially superposed on a sensitive object, comprising firing said energy beam through a density filter gradually reducing the exposure at said peripheral parts, detecting said energy beam by a photodetection device having a photodetector and light-blocking plate used for measurement of the distribution of exposure at portions corresponding to said peripheral parts on said sensitive object, and preparing a density filter formed with an attenuating part of said energy beam so that the distribution of exposure becomes a target value at said peripheral parts based on information relating to the difference between a size of said light-blocking plate and a size of an area irradiated by said energy beam, information relating to an attenuating characteristic of said density filter, and the result of said detection.

According to a 20th aspect of the present invention, there is provided a method of production of an exposure apparatus exposing by an energy beam each of a plurality of areas where peripheral parts are partially superposed on a sensitive object, comprising gradually reducing the exposure at said peripheral parts by preparing a density filter formed with an attenuating part of said energy beam so that the distribution of exposure becomes a target value at said peripheral parts based on a change in optical characteristics due to multiple exposure of said peripheral parts.

According to a 21st aspect of the present invention, there is provided an exposure apparatus exposing by an energy beam each of a plurality of areas where peripheral parts are partially superposed on a sensitive object, comprising a setting device gradually reducing the exposure at said peripheral parts, the setting device including a density filter having an attenuating part gradually reducing an energy of said energy beam, and the device changing the position of said density filter with respect to the patterns to be transferred to change the width of a second overlay part where an image of said attenuating part is superposed without changing the width of a first overlay part where said peripheral parts are superposed so as to adjust the exposure of said first overlay part.

According to a 22nd aspect of the present invention, there is provided an exposure apparatus exposing by an energy beam each of a plurality of areas where peripheral parts are partially superposed on a sensitive object, comprising a setting device gradually reducing the exposure at said peripheral parts, the setting device including a density filter having an attenuating part gradually reducing an energy of said energy beam, and the device changing the distribution of the energy beam limited by the density filter and the relative position with the patterns to be transferred so as to adjust the exposure at overlay parts where the peripheral parts are superposed.

According to a 23rd aspect of the present invention, there is provided an exposure apparatus exposing by an energy beam each of a plurality of areas where peripheral parts are partially superposed on a sensitive object, comprising a setting device gradually reducing the exposure at said peripheral parts, the setting device including a density filter having an attenuating part gradually reducing an energy of said energy beam, and the device changing the magnification of an optical system from said density filter to patterns to be transferred to change the width of a second overlay part where an image of said attenuating part is superposed without changing the width of a first overlay part where peripheral parts are superposed so as to adjust the exposure of said first overlay part.

According to a 24th aspect of the present invention, there is provided an exposure apparatus exposing by an energy beam each of a plurality of areas where peripheral parts are partially superposed on a sensitive object, comprising a setting device gradually reducing the exposure at said peripheral parts, the setting device including a density filter having an attenuating part gradually reducing an energy of said energy beam, and the device changing the optical characteristics of an optical system from said density filter to patterns to be transferred to change the distribution of the energy beam limited by said density filter and the relative position with the patterns to be transferred so as to adjust the exposure at overlay parts where the peripheral parts are superposed.

BRIEF DESCRIPTION OF THE DRAWINGS

These and other objects and features of the present invention will become clearer from the following description of the preferred embodiments given with reference to the attached drawings, in which:

FIG. 1 is a view of the general configuration of an exposure apparatus according to an embodiment of the present invention;

FIG. 10 is a flow chart of the method of adjusting a first distribution of exposure;

FIGS. 11A to 11C are views explaining a method of adjustment of a second distribution of exposure;

FIGS. 12A to 12C are views explaining a method of adjustment of a second distribution of exposure;

FIGS. 13A to 13C are views explaining a method of adjustment of a second distribution of exposure;

FIGS. 14A to 14C are views explaining a method of adjustment of a second distribution of exposure; and FIG. 15 is a view of another example of a setting device forming an inclined distribution.

DESCRIPTION OF THE PREFERRED EMBODIMENTS

Figure 2A:
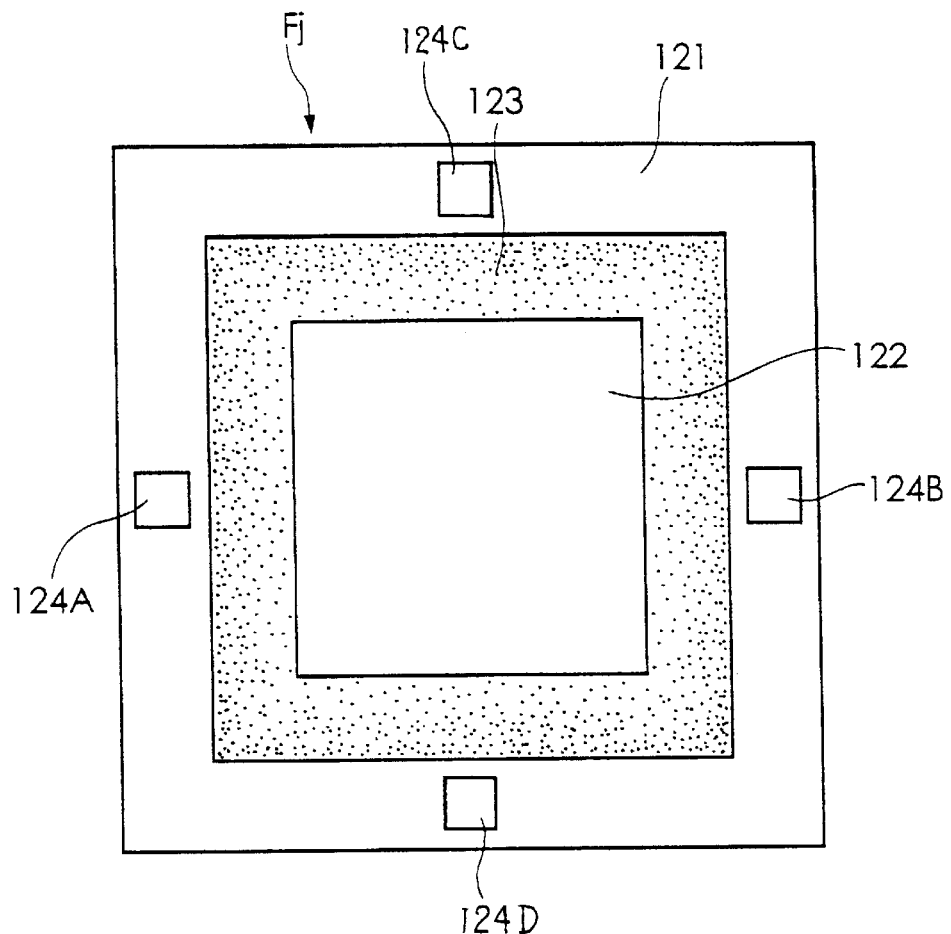
FIG. 2A is a top view of the configuration of a density filter.

Below, an explanation will be given of an embodiment of the present invention with reference to the drawings. FIG. 1 is a view of the general configuration of an exposure apparatus according to an embodiment of the present invention. The exposure apparatus is a step-and-repeat type stitching projection exposure apparatus. Further, in the following explanation, the XYZ orthogonal coordinate system shown in FIG. 1 is set and the positional relationships of the members explained while referring to the XYZ orthogonal coordinate system. The XYZ orthogonal coordinate system is set so that the X-axis and the Z-axis become parallel to the paper surface and so that the Y-axis becomes the direction orthogonal to the paper surface. Further, the XYZ coordinate system in the figure is set so that the XY plane becomes a plane parallel to the horizontal surface and the Z-axis becomes the perpendicular direction.

In FIG. 1, the ultraviolet pulse light IL of the light from a light source 100 (here, an ArF excimer laser) (hereinafter referred to as the "exposure light IL") passes through a beam matching unit (BMU) 101 including movable mirrors etc. for matching of the position of the optical path with the illumination optical system 1 and enters a variable light-attenuator 103 serving as a light-attenuator through a pipe 102.

A main control system 9 controls the amount of exposure of the resist on the substrate 4 by communicating with the light source 100 to start and start emission of light and control the output as determined by the oscillation wavelength and the pulse energy and to adjust the light-attenuation rate of the variable light-attenuator 103 with respect to the exposure light IL in stages or continuously.

The exposure light IL passing through the variable light-attenuator 103 passes through a beam shaping optical system comprised of lens systems 104 and 105 arranged along a predetermined light axis and enters an optical integrator (rod integrator or fly-eye lens etc., in the figure, a fly-eye lens). Further, two fly-eye lenses 106 may be arranged in series to enhance the uniformity of illumination distribution.

An aperture stop system 107 is arranged at the emission surface of the fly-eye lens 106. The aperture stop system 107 includes a circular aperture stop for normal illumination, an aperture stop for modified illumination comprised of a plurality of small offset apertures, an aperture stop for annular illumination, etc. arranged in a switchable manner. The illumination light IL emitted from the fly-eye lens 106 and passing through a predetermined aperture stop of the aperture stop system 107 enters a beam splitter 108 having a high transmittance and a low reflectance. The light reflected at the beam splitter 108 enters an integrator sensor 109 comprised of a photoelectric detector. The detection signal of the integrator sensor 109 is supplied through a not illustrated signal line to the main control system 9.

The transmittance and reflectance of the beam splitter 108 are measured to a high accuracy in advance and stored in a memory in the main control system 9. The main control system 9 is designed to be able to monitor the exposure light IL entering the projection optical system 3 indirectly by the detection signal of the integrator sensor 109.

The exposure light IL passing through the beam splitter 108 enters a reticle blind mechanism 110. The reticle blind mechanism 110 is comprised of four movable blinds 111 (A to D) and their drive mechanisms. By setting these four blinds 111 at suitable positions, a rectangular illumination field is formed at the approximate center of the field of the projection optical system 3.

The exposure light IL shaped into a rectangle by the blinds 111 of the reticle blind mechanism 110 enters a density filter Fj arranged on a filter stage FS. The density filter Fj (here, the nine filters F1 to F9) is basically configured as shown in FIG. 2A. FIG. 2A is a top view of an example of the configuration of the density filter Fj. The density filter Fj is comprised of a light transmitting substrate of quartz glass or fluorine-doped quartz glass or the like on which are formed a light blocking portion 121 on which chrome or another light blocking material is deposited, a light transmitting portion 122 on which no light blocking material is deposited, and a light-attenuating part 123 on which the light blocking material is deposited while changing the probability of presence. The light-attenuating part 123 has the light blocking material deposited on it in dots. The size of the dots becomes less than the resolution limit of the optical system having a plurality of optical elements (112 to 116) arranged between the density filter Fj an the master reticle Ri in the state where the density filter Fj is placed at the position shown in FIG. 1. The dots are formed to increase in probability of presence so that the light-attenuation rate becomes higher by a straight line the further from the inside (light transmitting portion 122 side) to the outside (light blocking portion 121 side). The dots may however also be formed by increasing their probability of presence so that the light-attenuation rate becomes higher in a curve the further from the inside to the outside.

The dots are preferably arranged not by arrangement of dots by the same pitch P at the same transmittance portion, but by arrangement by addition to P of a random number R having a Gaussian distribution generated for each dot, that is, a P+R system. The reason is that diffracted light is produced by the arrangement of dots. In some cases, the numerical aperture (NA) of the illumination system is exceeded and light does not reach the photosensitive substrate and therefore the error from the design transmittance becomes large.

Further, the sizes of the dots are preferably all the same. The reason is that if several sizes of dots are used, when error occurs from the design transmittance due to the aforementioned diffraction, the error becomes complicated, that is, correction of the transmittance becomes complicated.

The density filter is preferably produced by a high speed electron beam lithography system so as to reduce the error in the dot shape. Further, the shape of the dots is preferably a rectangular shape (square shape) for which process errors in shape can be easily measured. This has the advantage of easy correction of the transmittance in the case of any measurable shape error.

Figure 2B:
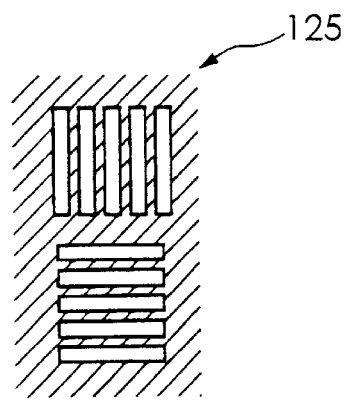
FIG. 2B is a view of an example of marks formed on a density filter.

The light blocking portion 121 is formed with a plurality of alignment marks 124A, 124B, 124C, and 124D. These marks 124A, 124B, 124C, and 124D, as shown in FIG. 2A, can be formed by removing parts of the light blocking portion 121 of the density filter Fj to form rectangular or other shaped apertures (light transmitting portions) 124A, 124B, 124C, and 124D. Further, it is possible to use the marks shown in FIG. 2B. FIG. 2B is a top view of an example of a mark formed on a density filter Fj. In FIG. 2B, use is made of a slit mark 125 comprised of a plurality of slit-shaped apertures. The slit mark 125 is comprised of a combination of a mark element comprised of slits formed in a Y-direction aligned in an X-direction and a mark element comprised of slits formed in an X-direction aligned in a Y-direction for measurement of the positions in the X-direction and Y-direction. The position and projection magnification of the density filter Fj are adjusted based on the results of measurement of the positional information of the marks 124A, 124B, 124C, and 124D. Further, for the position of the density filter Fj in the Z-direction and the amount of tilt in the Z-direction, a device provided on the sample table 5 is used for detecting marks of the density filter Fj by image pickup elements, the density filter Fj is moved in the direction of the optical path, the marks 124A, 124B, 124C, and 124D or the mark 125 are measured at a plurality of Z-directions, the Z-position giving the largest signal intensity or signal contrast is designated as the best focus position. The density filter Fj may be arranged at the best focus position (position conjugate with object plane or image plane of projection optical system 3, that is, pattern formation surface of master reticle Ri or surface of substrate 4), but in the present example the density filter is arranged at the position of a certain amount of defocus from that best focus position.

Further, the number of marks set at the density filter is not limited to four. It is sufficient to set one or more in accordance with the accuracy of setting etc. of the density filter. Further, in this example, the density filter was arranged so as to substantially match with the optical axis of the illumination optical system at its center and four marks were provided symmetrically with respect to the center (optical axis), but when providing a plurality of marks at the density filter, it is preferable to arrange the plurality of marks so as not to become point symmetric with respect to the center or to arrange the plurality of marks point symmetrically and form an identification pattern separately. This is so that when arranging the density filter in the illumination optical system, measuring the energy distribution, then taking out the density filter, making corrections, and resetting it, since the density filter is corrected taking into consideration the optical characteristics (distortion etc.) of the illumination optical system, if the density filter is reset rotated, the correction will become meaningless, that is, this is for enabling the density filter to be reset in its original state.

In the present embodiment, a shelf-like filter library 16a is arranged at the side of the filter stage FS. This filter library 16a has L number (L is a natural number) of support shelves 17b successively arranged in the Z-direction. Density filters F1, ..., FL are carried on the support shelves 17a. The filter library 16b is supported to be movable in the Z-direction by a slider 18a. A loader 19a able to freely rotate and provided with an arm able to move in a predetermined range in the Z-direction is arranged between the filter stage FS and the filter library 16a. The main control system 9 adjusts the position of the filter library 16a in the Z-direction through the slider 18a, then controls the operation of the loader 19b to enable transfer of desired density filters F1 to FL between the desired support shelves 17a of the filter library 16a and the filter stage FS.

The light-blocking part 121, light-transmitting part 122, and light-attenuating part 123 of the density filter Fj are formed by correction in advance so as to become suitable shapes on the pattern formation surface in accordance with the distance in the direction along the optical axis between the surface conjugate with the pattern formation surface of the master reticle Ri and the density filter Fj in the state held on the filter stage FS. Further, in this example, the density filter Fj is arranged away from the conjugate surface, that is, the dots in the light-attenuating part 123 are defocused on the pattern formation surface of the master reticle Ri, so depending on the distance from the conjugate surface (interval), the size of the dots does not have to be made less than the resolution limit. Further, instead of arranging the density filter Fj away from the conjugate surface or in combination with this, it is also possible to adopt a configuration blurring the images of the dots in the light-attenuating part 123 on the pattern formation surface of the master reticle Ri (for example, enabling fine movement of a diffusion plate arranged between the density filter Fj and the master reticle Ri). In this case as well, the size of the dots does not have to be made less than the resolution limit. Further, while details will be given later, the master reticle Ri may be any of a plurality of master reticles R1 to RN formed with parent patterns P1 to Pn obtained by partitioning the parent pattern 36 of FIG. 6.

In the present embodiment, there are nine density filters Fj, that is, the filters F1 to F9 shown in FIG. 3A to FIG. 3I.

FIG. 3A to FIG. 3I are views of the configurations of the density filters provided in the exposure apparatus of an embodiment of the present invention. These differ from each other in the shapes or positions of the light-attenuating parts 123 and are selectively used in accordance with whether there are portions where the images of patterns overlap* between adjoining shot areas at the four sides of the shot areas to be exposed (hereinafter referred to as "stitching portions").

Figure 3A:
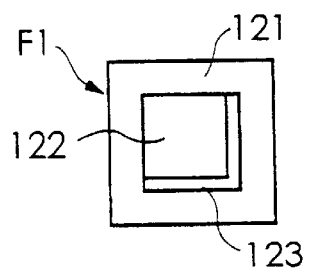
FIG. 3A to FIG. 3I are views of configurations of light-attenuating parts of density filters.
Figure 3B:
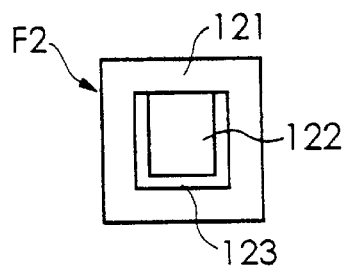
Figure 3C:
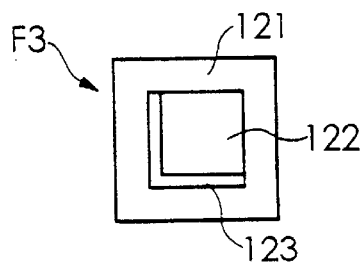
Figure 3D:
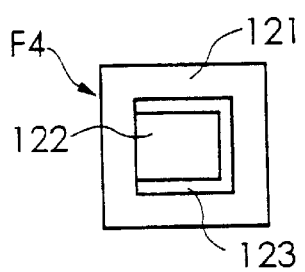
Figure 3E:
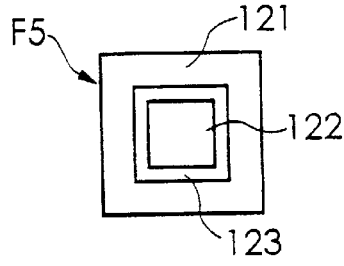
Figure 3F:
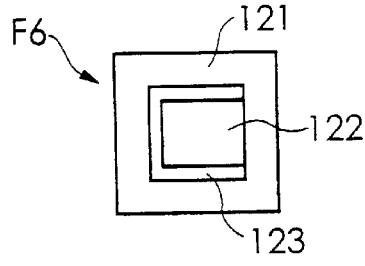
Figure 3G:
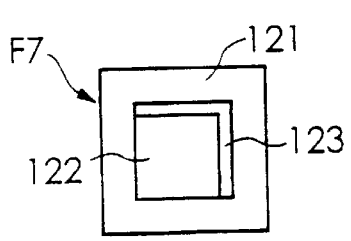
Figure 3H:
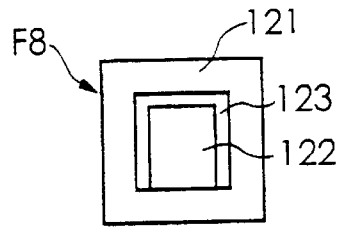
Figure 3I:
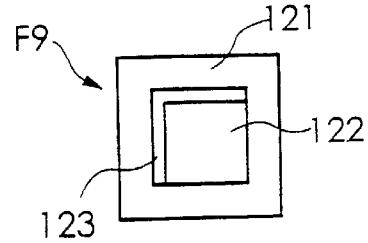

That is, in the case of a shot matrix of p (rows)×q (columns), the density filter of FIG. 3A is used for the shot (1,1), the density filter of FIG. 3B is use for the shot (1,2 to q−1), the density filter of FIG. 3C is used for the shot (1,q), the density filter of FIG. 3D is used for the shot (2 to p−1, 1), the density filter of FIG. 3E is used for the shot (2 to p−1, 2 to q−1), the density filter of FIG. 3F is used for the shot (2 to p−1, q), the density filter of FIG. 3G is used for the shot (p,1), the density filter of FIG. 3H is used for the shot (p,2 to q−1), and the density filter 3I is used for the shot (p,q).

Further, the density filter Fj is not limited to the above nine types. It is possible to use ones having light-attenuating parts 123 of other shapes in accordance with the shape of the shot areas and the shot matrix. The density filters Fj may be provided in a one-to-one correspondence with the master reticles Ri, but use of the same density filter Fj for exposure of several master reticles Ri enables the number of the density filters Fj to be reduced and is more efficient.

If the density filters Fj are made able to be used rotated 90 degrees or 180 degrees, by preparing for example the three types of density filters Fj of FIG. 3A, FIG. 3B, and FIG. 3E, the other density filters become unnecessary and efficiency is greater. Further, if the single density filter Fj shown in FIG. 3E is used and the positions of the four blinds 111 of the reticle blind mechanism 110 are selectively set or a light blocking band of the master reticle Ri is used to block one or more of the four sides of the light-attenuating part 123 by the corresponding blinds 111, it is possible to realize the functions of the density filters shown in FIG. 3A to FIG. 3I and other density filters by a single density filter.

Further, the density filter Fj is not limited to one comprised of a glass substrate formed with a light-attenuating part or light blocking portion by chrome etc. Use may also be made of ones using liquid crystal elements etc. to enable the positions of the light blocking portions or light-attenuating parts and the light-attenuating characteristics of the light-attenuating parts to be changed in accordance with need. In this case, there is no longer a need to prepare several density filters and various demands in the specifications of the working reticles (microdevices) produced can be flexibly dealt with.

The filter stage FS indexes or moves the density filters Fj held in the rotational direction or translational direction in the XY plane. Not shown laser interferometers are used to measure the X-coordinate, Y-coordinate, and rotational angle of the filter stage FS. The operation of the filter stage FS is controlled by the measured values and the control information from the main control system 9. Details of the method of setting the light-attenuating parts 123 of the density filters Fj explained above and the method of producing the density filters Fj will be explained later.

The exposure light IL passing through a density filter Fj travels via a reflection mirror 112 and condenser mirror 113, an imaging lens system 114, a reflection mirror 115, and a main condenser lens system 116 to strike an illuminated area similar to the rectangular aperture of the blinds 111 on the circuit pattern area of the master reticle Ri by a uniform intensity distribution. That is, the plane of arrangement of the apertures of the blinds 111 is substantially conjugate with the pattern formation surface of the master reticle Ri due to the combined system of the condenser lens system 113, the imaging lens system 114, and the main condenser lens system 116.

The exposure light IL emitted from the illumination optical system 1 illuminates a master reticle Ri held on the reticle stage 2. The reticle stage 2 holds the i-th (i=1 to N) master reticle Ri.

In the present embodiment, a shelf-like reticle library 16b is arranged at the side of the reticle stage 2. This reticle library 16b has N number (N is a natural number) of support shelves 17b successively arranged in the Z-direction. Master reticles R1, . . . , RN are carried on the support shelves 17b. The reticle library 16b is supported to be movable in the Z-direction by a slider 18b. A loader 19b able to freely rotate and provided with an arm able to move in a predetermined range in the Z-direction is arranged between the reticle stage 2 and the reticle library 16b. The main control system 9 adjusts the position of the reticle library 16b in the Z-direction through the slider 18b, then controls the operation of the loader 19b to enable transfer of desired master reticles F1 to FL between the desired support shelves 17b of the reticle library 16b and the reticle stage 2.

Figure 4:
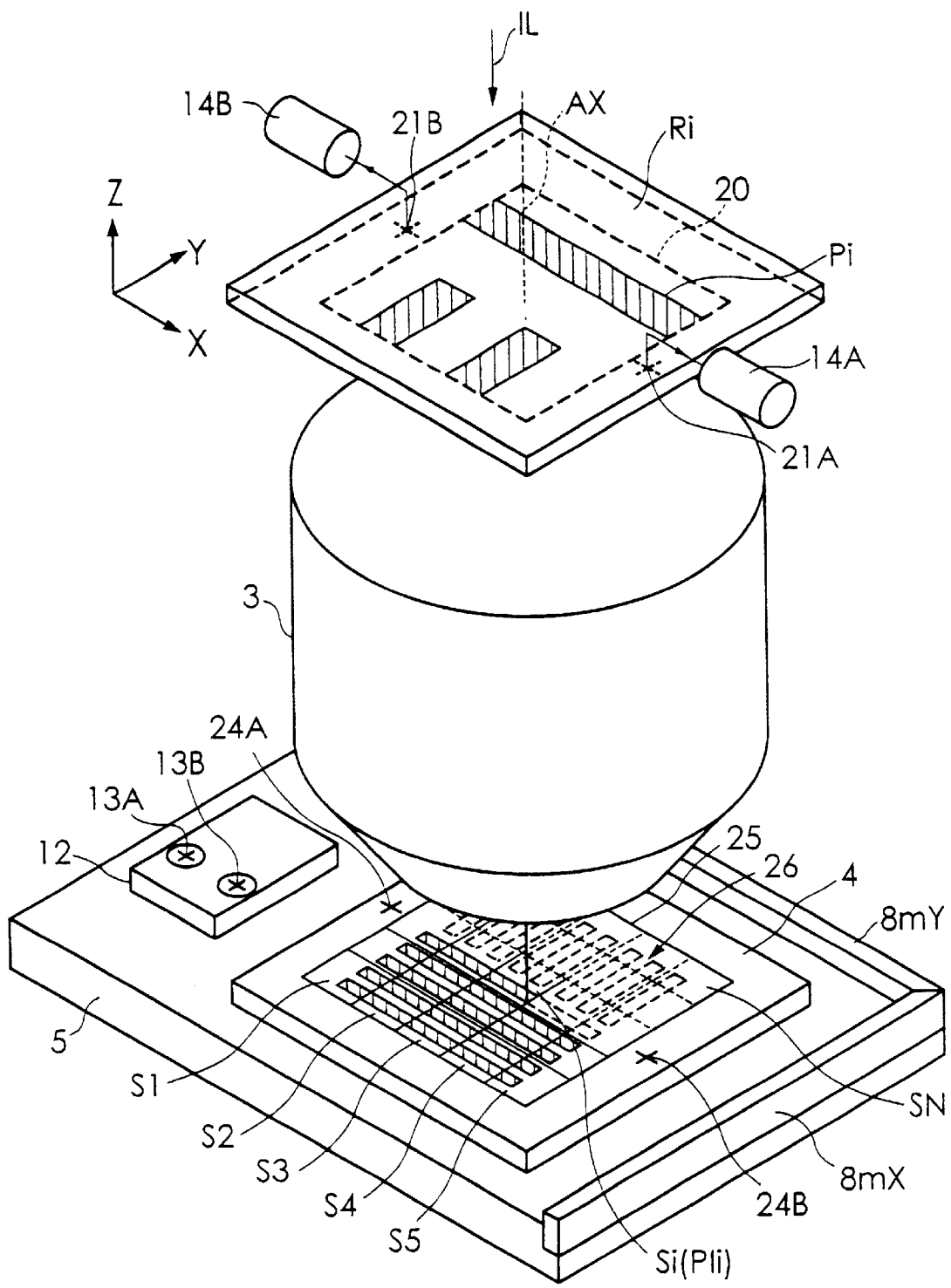
FIG. 4 is a perspective view of the case when projecting reduced images of parent patterns of a master reticle on a substrate.

The images of the patterns in the illuminated area of the master reticle Ri are projected on the surface of the substrate for the working reticle (blank) 4 at a reduction rate 1/α (α is for example 5, 4, etc.) through a projection optical system 3. FIG. 4 is a perspective view showing the case of projecting reduced images of parent patterns of a master reticle on to a substrate. In FIG. 4, members the same as the members of the exposure apparatus shown in FIG. 1 are assigned the same reference numerals. In FIG. 1 and FIG. 4, the substrate 4 is a light-transmitting substrate such as quartz glass. A thin film of a mask material such as chrome or molybdenum silicide is formed on the pattern area of the surface. Alignment marks 24A and 24B comprised of two two-dimensional marks for positioning use are formed so as to straddle the pattern area 25.

The alignment marks 24A and 24B are formed in advance before transfer of the patterns by using an electron beam lithography system, laser beam lithography system, projection exposure apparatus (stepper, scanner), etc. Further, the surface of the substrate 4 is coated with a photoresist so as to cover the mask material.

The reticle stage 2 moves the held master reticle Ri in the XY plane in the rotational direction and the translational direction. The X-coordinate, Y-coordinate, and rotational angle of the reticle stage 2 are measured by not shown laser interferometers. The operation of the reticle stage 2 is controlled by the measured values and the control information from the main control system 9.

On the other hand, the substrate 4 is prevented from positional deviation due to deformation of the substrate by, in the present example, by being placed on a holder comprised of three pins without suction or with soft suction. The substrate holder is affixed on the sample table 5. The sample table 5 is affixed on the substrate stage 6. The sample table 5 matches the surface of the substrate 4 with the imaging plane of the substrate 4 by control of the focal position (position in optical axis AX direction) and angle of tilt of the substrate 4 by the auto focus system. The sample table 5 has affixed to it an illumination distribution detection sensor 126 for detecting the illumination distribution on the positioning use fiducial mark member 12 and substrate 4 (so-called illumination uniformity sensor). Further, the substrate stage 6 moves and positions the sample table 5 (substrate 4) on the base 7 in the X-direction and Y-direction by for example a linear motor.

The X-coordinate, Y-coordinate, and rotational angle of the sample table 5 are measured by movable mirrors 8m affixed above the sample table 5 and laser interferometers 8 arranged facing them. The measured values are supplied to a stage control system 10 and main control system 9. "Movable mirrors 8m" is a generic term for the X-axis movable mirror 8mX and the Y-axis movable mirror 8mY as shown in FIG. 4. The stage control system 10 controls the operation of the linear motor etc. of the substrate stage 6 based on the measured values and the control information from the main control system 9.

Figure 5A:
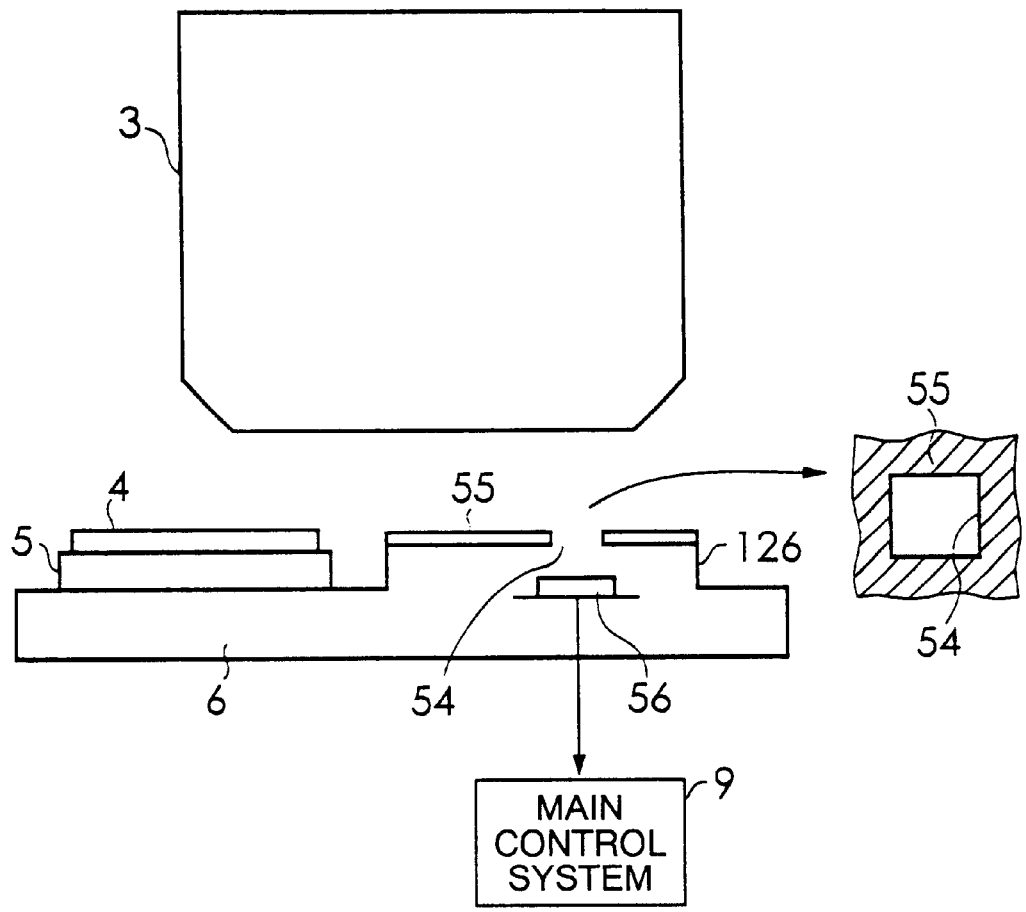
FIGS. 5A and 5B are views of the configuration of an illumination distribution detection sensor.
Figure 5B:
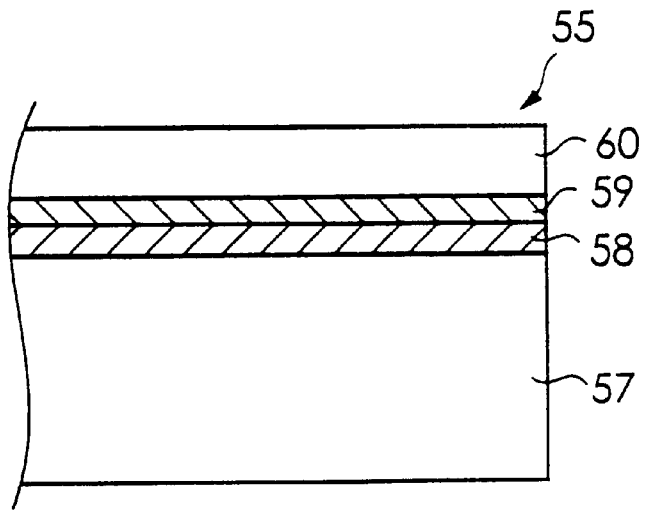

Next, details of the illumination distribution detection sensor 126 will be explained. FIG. 5A and FIG. 5B are views showing the configuration of the illumination distribution detection sensor 126. This illumination distribution detection sensor 126 is for measuring the spatial distribution of exposure light IL, that is, the distribution of intensity of the exposure light (illumination distribution), by making the substrate stage 6 move in a plane horizontal with the substrate 4 in the state with the exposure light IL illuminated through the projection optical system 3. As shown in FIG. 5A, the illumination distribution detection sensor 126 is comprised of a photoelectric sensor 56 provided below the light-blocking plate 55 having the rectangular (in the present embodiment, square) aperture 54. The detection signal of the photoelectric sensor 56 is output to the main control system 9. Further, it is possible to not provide a photoelectric sensor 56 below the aperture 54, but to guide the light by a light guide etc. and have the amount of light received detected by a photoelectric sensor etc. at another portion.

The light-blocking plate 55 is usually comprised of a quartz or other substrate on which chrome (Cr) or other metal is deposited, but if chrome or another metal is deposited, the reflectance of the exposure light used for exposure on the light-blocking plate 55 is high and the amount of reflection of the exposure light is large. As a result, flare occurs due to the reflection of the light reflected at the light-blocking plate 55 at the projection optical system or reticle. The illumination distribution detection sensor 126 is provided to measure the spatial distribution of exposure light when the substrate 4 is exposed. It is most preferable to measure the spatial distribution of exposure at the time of actual exposure. When measuring the spatial distribution of exposure light, however, if the situation differs from the situation at the time of actual exposure, that is, the amount of reflection of the exposure light becomes greater, it is not possible to accurately measure the spatial distribution of exposure light at the time of actual exposure.

Therefore, in the present embodiment, to measure as close as possible the actual spatial distribution of exposure light at the time of exposure, the reflectance of the top surface of the light-blocking plate 55 is made substantially the same in degree as the reflectance of the substrate 4 to reduce the effect due to the reflected light. A film having a reflectance of the same extent as the reflectance of the substrate 4 is formed at the wavelength region of the exposure light on the top surface of the light-blocking plate 55. To realize this film, for example, as shown in FIG. 5B, chrome 58 is deposited on the quartz transparent substrate 57, a thin film 59 of chrome oxide is formed on the chrome 58, and a photoresist 60 the same as the photoresist coated on the substrate 4 is coated to the same thickness. The reflectance of the top surface of the light-blocking plate 55 can be adjusted by suitably selecting not only the material of the film formed on the surface, but also the thickness or configuration (number of layers stacked, thickness of layers, material of layers, etc.) When an anti-reflection film etc. is formed on the substrate 4, the reflectance of the top surface of the light-blocking plate 55 is set considering all such conditions as well.

By measuring the exposure light passed through the aperture 54 formed in the light-blocking plate 55 using the illumination distribution detection sensor 126 while moving the substrate stage 6 in the plane horizontal to the surface of the substrate 4, it is possible to measure a spatial distribution substantially the same as the spatial distribution of exposure light at the time of actual exposure.

Further, the main control system 9 has connected to it a magnetic disk drive or other storage device 11. The storage device 11 stores an exposure data file. The exposure data file records the positional relationship among the master reticles R1 to RN, the correspondence of the density filters F1 to F1 with respect to the master reticles R1 to RNd, the alignment information, etc.

The exposure apparatus according to the present invention performs stitch exposure using a plurality of master reticles. This exposure apparatus is used not only when producing a semiconductor integrated circuit, but also when producing a reticle. Here, the explanation will be given of the method of producing the reticle produced using this master reticle Ri and this exposure apparatus, that is, the working reticle 34.

Figure 6:
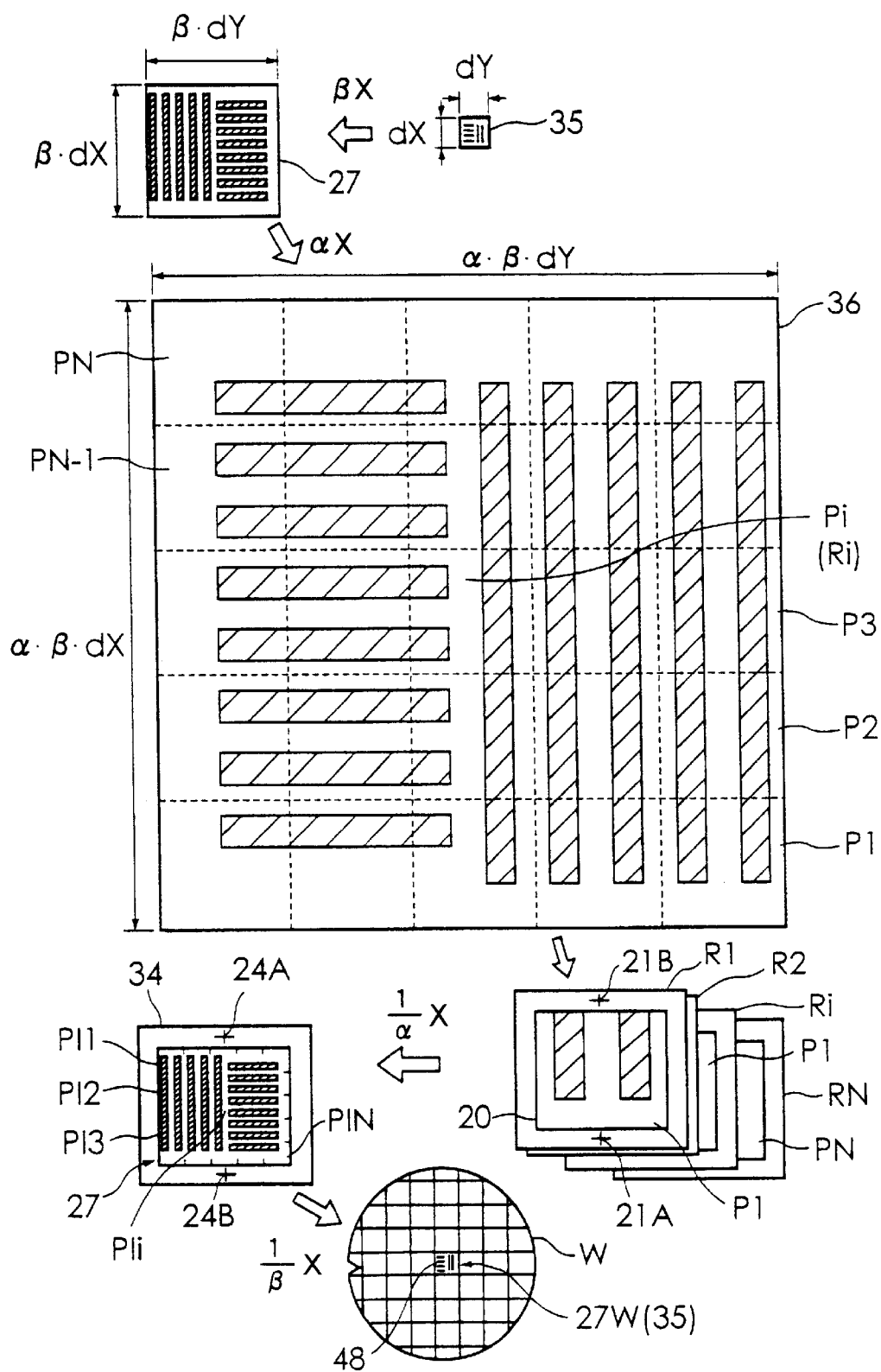
FIG. 6 is a view for explaining a process of production when producing a reticle (working reticle) using a master reticle.

FIG. 6 is a view for explaining the process of production when producing a reticle (working reticle) using a master reticle Ri. The working reticle 34 shown in FIG. 6 is the finally produced reticle. The working reticle 34 is comprised of a light-transmitting substrate made of quartz glass or the like (blank) on one surface of which is formed a master pattern 27 for transfer by chrome (Cr), molybdenum silicide ($MoSi_2$ etc.), or another mask material. Further, two alignment marks 24A and 24B are formed so as to straddle the master pattern 27.

The working reticle 34 is used in reduction projection of $1/\beta$ (where $\beta$ is an integer larger than 1 or a half integer etc., for example, 4, 5, or 6) through a projection optical system of an optical type projection exposure apparatus. That is, in FIG. 6, a reduced image 27W of $1/\beta$ times the master patterns 27 of the working reticle 34 is exposed on each shot area 48 of a wafer W coated with a photoresist, then developed or etched etc. to form predetermined a circuit pattern on each shot area 48.

In FIG. 6, first the circuit pattern 35 of a certain layer of the semiconductor device to be finally produced are designed. The circuit pattern 35 forms various line-and-space patterns (or isolated patterns) in a rectangular area with widths of perpendicularly intersecting sides of dX and dY. In this embodiment, the circuit pattern 35 is enlarged $\beta$ times to prepare a master pattern 27 comprised of a rectangular area with widths of perpendicularly intersecting sides of $\beta \cdot dX$ and $\beta \cdot dY$ in the image data of the computer. The multiple $\beta$ is a reciprocal of the reduction rate ($1/\beta$) of the projection exposure apparatus where the working reticle is to be used. Further, the image is inverted and enlarged at the time of inversion projection.

Next, the master pattern 27 is enlarged $\alpha$-fold ($\alpha$ is an integer larger than 1 or a half integer, for example, 4, 5, or 6) to prepare, in the image data, a parent pattern 36 comprised of a rectangular area with widths of perpendicularly intersecting sides of $\alpha \cdot \beta \cdot dX$ and $\alpha \cdot \beta \cdot dY$. The parent pattern 36 is then partitioned longitudinally and laterally into $\alpha$ number of sections to prepare $\alpha \times \alpha$ number of parent patterns P1, P2, P3 . . . , PN ($N=\alpha^2$) in the image data. In FIG. 6, the case where $\alpha=5$ is shown. Further, the magnification $\alpha$ is the reciprocal of the projection magnification of the projection exposure apparatus used in the production of the working reticle 34 (in this example, the magnification of the projection optical system 3 in FIGS. 1 and 4). Further, the divisor a of the parent pattern 36 does not necessarily have to match the magnification $\alpha$ of the master pattern 27 to the parent pattern 36. Next, these parent patterns Pi (i=1 to N) are used to produce lithographic data for an electron beam lithography system (or laser beam lithography system) and these parent patterns Pi are transferred on to the master reticle Ri as parent masks at equal magnification rates.

For example, when producing one master reticle Ri, a thin film of chrome or molybdenum silicide or other mask material is formed on a light transmitting substrate of quartz glass etc., an electron beam resist is coated on this, then the electron beam lithography system is used to draw an equal magnification latent image of the first parent pattern P1 on the electron beam resist. Next, the electron beam resist is developed, then is etched and the resist peeled off etc. to form the parent pattern P1 on the pattern area 20 on the master reticle R1.

At this time, alignment marks 21A and 21B comprised of two 2-dimensional marks are formed in a predetermined positional relationship at the parent pattern P1. In the same way, an electron beam lithography system is used to form parent patterns Pi and alignment marks 21A and 21B on other master reticles Ri. These alignment marks 21A and 21B are used for positioning with respect to the substrate or density filter.

In this way, the parent patterns Pi drawn by the electron beam lithography system (or laser beam lithography system) are patterns of the master pattern 27 enlarged $\alpha$-times, so the amounts of the lithographic data are reduced to about $1/\alpha^2$ compared with when directly drawing the master pattern 27. Further, the minimum line width of the parent patterns Pi is $\alpha$-times (for example 5-times or 4-times) the minimum line width of the master pattern 27, so the parent patterns Pi can be drawn in a short time and at a high accuracy by an electron beam lithography system using conventional electron beam resists. Further, by producing N number of master reticles R1 to RN at one time, it is possible to produce the number of necessary working reticles 34 by repeatedly using them, so the time for producing the master reticles R1 to RN does not become a large burden. The working reticle 34 is produced by using the thus produced N number of master reticles Ri and transferring the $1/\alpha$-size reduced images PIi (i=1 to N) of the parent patterns Pi of the master reticles Ri while stitching them together (while partially overlaying them).

Details of the exposure operation of the working reticle 34 using the master reticle Ri will be explained next. First, a first shot area on the substrate 4 is moved to the exposure area (projection area) of the projection optical system 3 by step motion of the substrate stage 6. In parallel with this, a master reticle R1 is loaded and held from the reticle library 16b to the reticle stage 2 through the loader 19b, and a density filter F1 is loaded and held from the filter library 16a to the filter stage FS through the loader 19a. The master reticle R1 and the density filter F1 are aligned etc., then a reduced image of the master reticle Ri is transferred to the corresponding shot area on the substrate 4 through the projection optical system 3.

When the reduced image of the first master reticle R1 finishes being exposed on the first shot area on the substrate 4, the next shot area on the substrate 4 is moved to the exposure area of the projection optical system 3 by step motion of the substrate stage 6. In parallel with this, the master reticle Ri on the reticle stage 2 is unloaded to the library 16 through the loader 19, the next master reticle R2 to be transferred is loaded and held from the library 16 to the reticle stage 2 through the loader 19, the density filter F1 on the filter stage FS is unloaded to the library 16 through the loader 19, and the next density filter F2 corresponding to the master reticle R2 to be transferred is loaded and held from the library 16 to the filter stage FS through the loader 19. The master reticle R2 and the density filter F2 are aligned etc., then a reduced image of the master reticle R2 is transferred to the corresponding shot area on the substrate 4 through the projection optical system 3.

After this, by the step-and-repeat system, reduced images of the corresponding master reticles R3 to RN are exposed and transferred on to the remaining shot areas of the substrate 4 while suitably changing the density filters F2 to FN according to need.

Note that when projecting and exposing the reduced images of the master reticles R1 to RN on the substrate 4 in this way, it is necessary to stitch the adjoining images at a high accuracy. Toward this end, it is necessary to align the master reticles Ri (i=1 to N) and the corresponding shot areas (Si) on the substrate 4 with a high accuracy. For this alignment, the projection exposure apparatus of the present embodiment is provided with reticle and substrate alignment mechanisms.

Figure 7:
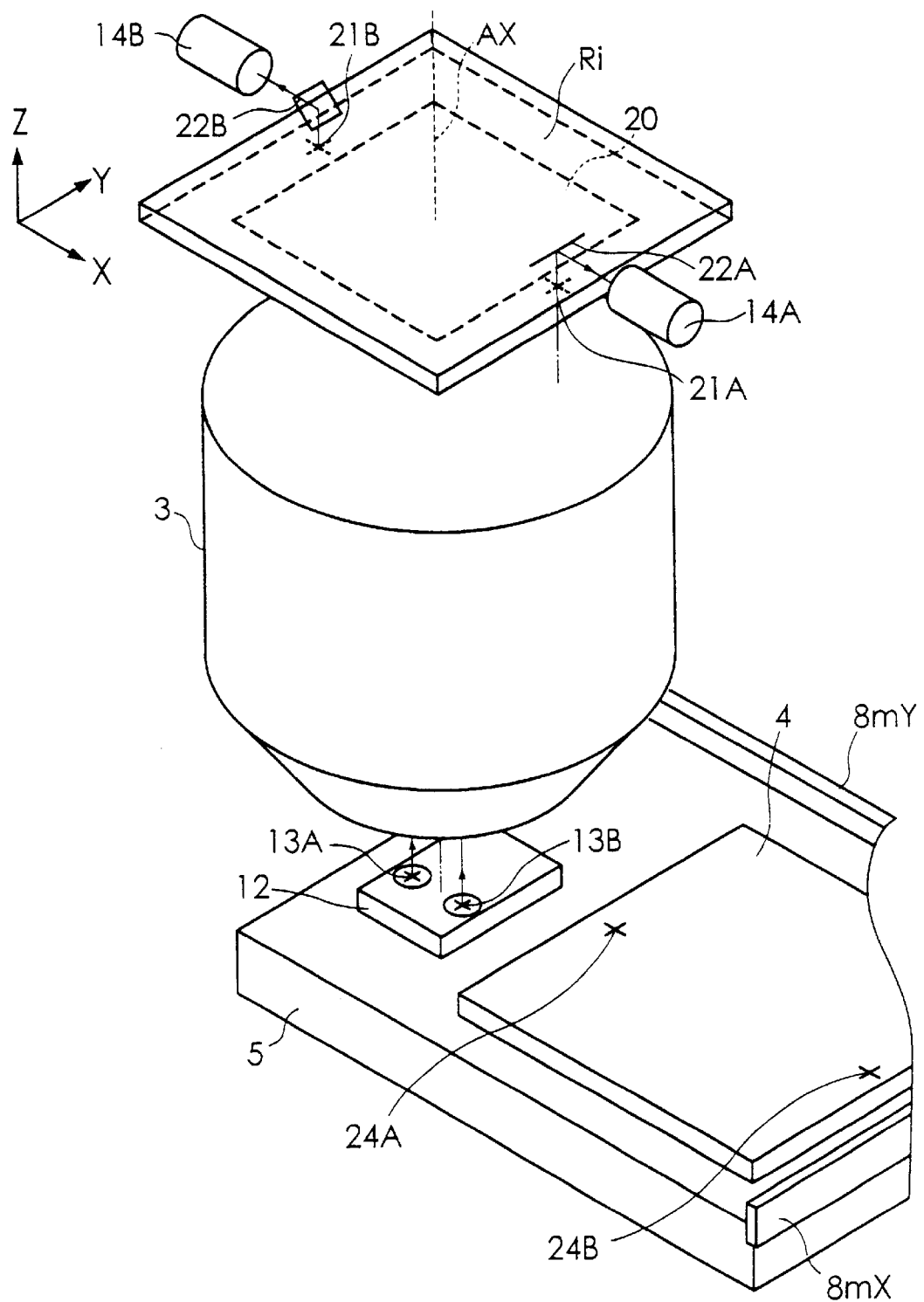
FIG. 7 is a perspective view of an alignment mechanism of a reticle.

FIG. 7 shows the reticle alignment mechanism. In FIG. 7, a light transmitting fiducial mark member 12 is affixed near the substrate 4 on the sample table 5. Two cross-shaped fiducial marks 13A and 13B are for example formed at a predetermined interval in the X-direction on the fiducial mark member 12. At the bottoms of the fiducial marks 13A and 13B is placed an illumination system for illuminating the fiducial marks 13A and 13B at the projection optical system 3 side by illumination light branched from the exposure light IL. When aligning a master reticle Ri, the substrate stage 6 of FIG. 1 is driven to position the fiducial marks 13A and 13B so that the center point between the fiducial marks 13A and 13B on the fiducial mark member 12 substantially registers with the optical axis AX of the projection optical system 3 as shown in FIG. 7.

Further, for example, two cross-shaped alignment marks 21A and 21B are formed so as to straddle the pattern area 20 of the pattern surface (bottom surface) of the master reticle Ri in the X-direction. The distance between the fiducial marks 13A and 13B is set to be substantially equal to the distance between images of the alignment marks 21A and 21B reduced by the projection optical system 3. By illumination by illumination light of the same wavelength as the exposure light IL from the bottom of the fiducial mark member 12 in the state with the center point between the fiducial marks 13A and 13B substantially in register with the optical axis AX in the above way, images of the fiducial marks 13A and 13B enlarged by the projection optical system 3 are formed near the alignment marks 21A and 21B of the master reticle Ri.

Mirrors 22A and 22B are arranged above the alignment marks 21A and 21B to reflect the illumination light from the projection optical system 3 side in the ±X directions. Image processing type alignment sensors 14A and 14B are provided by a TTR (through-the-reticle) system so as to receive the illumination light reflected by the mirrors 22A and 22B. The alignment sensors 14A and 14B are each provided with an imaging system and a 2-dimensional image pickup element such as a CCD camera. The image pickup elements pick up the images of the alignment marks 21A and 21B and the corresponding fiducial marks 13A and 13B and supply image signals to an alignment signal processing system 15 of FIG. 1.

The alignment signal processing system 15 processes the image signals to find the amount of positional deviation of the alignment marks 21A and 21B in the X-direction and Y-direction with respect to the fiducial marks 13A and 13B and supplies the two positional deviations to the main control system 9. The main control system 9 positions the reticle stage 2 so that the two positional deviations become symmetrical and within predetermined ranges. Due to this, the alignment marks 21A and 21B and in turn the parent pattern Pi in the pattern area 20 of the master reticle Ri (see FIG. 6) are positioned with respect to the fiducial marks 13A and 13B.

In other words, the center (exposure center) of the reduced image of the parent pattern Pi of the master reticle Ri obtained by the projection optical system 3 is positioned at the center point between the fiducial marks 13A and 13B (substantially the optical axis AX) and the perpendicularly intersecting sides of the contour of the parent pattern Pi (contour of pattern area 20) are set to be parallel to the X-axis and Y-axis. In this state, the main control system 9 of FIG. 9 stores the X-direction and Y-direction coordinates $(XF_0, YF_0)$ of the sample table 5 measured by the laser interferometers 8, whereby the alignment operation of the master reticle Ri ends. After this, it is possible to move any point on the sample table 5 to the exposure center of the parent pattern Pi.

Further, as shown in FIG. 1, an image processing type alignment sensor 23 is provided by an off-axis system at the side of the projection optical system 3 to detect the position of a mark on the substrate 4. The alignment sensor 23 illuminates a detection mark by illumination light of a wide band to which the photoresist is not sensitive, picks up the image of the detection mark by a two-dimensional image pickup element such as a CCD camera, and supplies an image signal to the alignment signal processing system 15. Further, the distance (base line amount) between the detection center of the alignment center 23 and the center of the projected image of the pattern of the master reticle Ri (exposure center) is found in advance using a predetermined fiducial mark on the fiducial mark member 12 and stored in the main control system 9.

As shown in FIG. 7, two cross-shaped alignment marks 24A and 24B are formed at the ends of the substrate 4 in the X-direction. After the master reticle Ri is aligned, the substrate stage 6 is driven to successively move the fiducial marks 13A and 13B and the alignment marks 24A and 24B on the substrate 4 to the detection area of the alignment sensor 23 of FIG. 1 and measure the positional deviations of the fiducial marks 13A and 13B and the alignment marks 24A and 24B with respect to the detection center of the alignment sensor 23. The results of the measurements are supplied to the main control system 9. Using these measurement results, the main control system 9 finds the coordinates $(XP_0, YP_0)$ of the sample table 5 when the center point between the fiducial marks 13A and 13B is in register with the detection center of the alignment sensor 23 and the coordinates $(XP_1, YP_1)$ of the sample table 5 when the center point between the alignment marks 24A and 24B is in register with the detection sensor of the alignment sensor 23. This ends the alignment operation of the substrate 4.

As a result, the distances between the center point between the fiducial marks 13A and 13B and the center point between the alignment marks 24A and 24B in the X-direction and the Y-direction become ($XP_0-XP_1$, $YP_0-YP_1$). Therefore, by driving the substrate stage 6 of FIG. 1 by exactly the distances ($XP_0-XP_1$, $YP_0-YP_1$) with respect to the coordinates ($XF_0$,$YF_0$) of the sample table 5 at the time of alignment of the master reticle Ri, it is possible to bring the center point between the alignment marks 24A and 24B of the substrate 4 (center of substrate 4) into register with the center point between the projected images of the alignment marks 21A and 21B of the master reticle Ri (exposure center) with a high accuracy as shown in FIG. 4. From this state, the substrate stage 6 of FIG. 1 may be driven to move the sample table 5 in the X-direction and the Y-direction so as to expose a reduced image PIi of a parent pattern Pi of the master reticle Ri at a desired position with respect to the center of the substrate 4.

That is, FIG. 4 shows the state where a parent pattern Pi of an i-th master reticle Ri is reduced and transferred on to the substrate 4 through the projection optical system 3. In FIG. 4, a rectangular pattern area 25 surrounded by sides parallel to the X-axis and Y-axis is virtually set in the main control system 9 centered on the center point between the alignment marks 24A and 24B of the surface of the substrate 4. The size of the pattern area 25 is the size of the parent pattern 36 of FIG. 6 reduced to $1/\alpha$. The pattern area 25 is partitioned equally into $\alpha$ sections in the X-direction and the Y-direction to virtually set shot areas S1, S2, S3, . . . , SN ($N=a^2$). The position of a shot area Si (i=1 to N) is set to the position of a reduced image PIi of the i-th parent pattern Pi when assuming reducing and projecting the parent pattern 36 of FIG. 1 through the projection optical system 3 of FIG. 4.

Further, when exposing one substrate 4, regardless of the change of the master reticle Ri, the substrate 4 is placed, without suction or with soft suction, on the sample table 5 comprised of the three pins, and the substrate stage 6 is made to move by a super-low acceleration and a super-low speed so that the position of the substrate 4 does not shift at the time of exposure. Therefore, since the positional relationship between the fiducial marks 13A and 13B and the substrate 4 does not change during the exposure of one substrate 4, when exchanging the master reticles Ri, it is sufficient to position the master reticle Ri with respect to the fiducial marks 13A and 13B. There is no need to detect the positions of the alignment marks 24A and 24B on the substrate 4 for each master reticle.

Above, an explanation was given of the positioning of the master reticle Ri and the substrate 4, but the master reticle Ri and the density filter may also be positioned relative to each other based on the results of measurement of the positional information of the marks 124A, 124B, 124C, and 124D or the slit mark 125. At this time, a slight rotation sometimes occurs in the substrate 4 due to the properties of the substrate stage 6, the yawing error, and other error. Therefore, a slight deviation occurs in the relative postures of the master reticle Ri and the substrate 4. This error is measured in advance or measured during actual processing and the reticle stage 2 or substrate stage 6 controlled so that the postures of the master reticle Ri and the substrate 4 are corrected to become in register so as to cancel this error out.

After this processing, the main control system 9 projects and exposes the reduced image of the parent pattern Pi on a shot area Si of the substrate 4. In FIG. 4, a reduced image of a parent pattern already exposed in the pattern area 25 of the substrate 4 is shown by a solid line, while an unexposed reduced image is shown by a broken line.

By successively exposing reduced images of parent patterns P1 to PN of the N number of master reticles R1 to RN of FIG. 1 on the corresponding shot areas Si to SN of the substrate 4 in this way, the reduced images of the parent patterns P1 to PN are exposed while being stitched with the reduced images of the adjoining parent patterns. Due to this, the projected image 26 of the parent pattern 36 of FIG. 1 reduced to $1/\alpha$ is exposed and transferred on to the substrate 4. Next, the photoresist on the substrate 4 is developed and etched and the remaining resist pattern is peeled off, whereby the projected image 26 on the substrate 4 forms the master pattern 27 as shown in FIG. 6 and the working reticle 34 is completed.

When positioning the density filters Fj, reticles Rj, and substrate 4 in the above way and performing exposure while stitching the images, however, when positioning the substrate 4 and exposing it while stitching, the distribution of exposure near overlay parts is measured in advance and the exposure performed using a density filter designed so that the exposure of overlay parts and the exposure of portions other than overlay parts become equal. If exposing while stitching using such a density filter Fj, the distribution of exposure shown in FIG. 8A and FIG. 8B should be obtained.

Figure 8A:
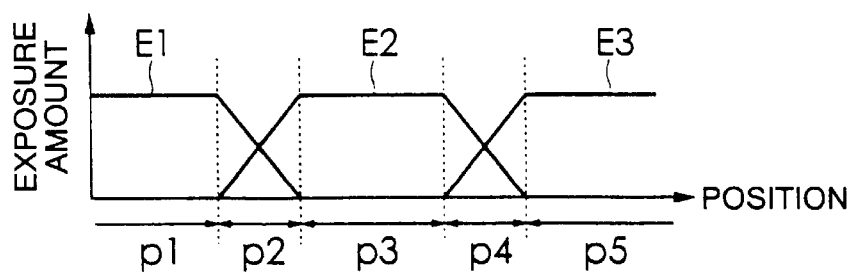
FIGS. 8A to 8D are views of examples of the distribution of exposure in overlay parts and portions other than overlay parts.

FIG. 8A to FIG. 8D are views of examples of the distribution of exposure at overlay parts and portions other than overlay parts. In FIG. 8A, references E1, E2, and E3 show the distributions of exposure at different shots. The exposure is set to gradually decrease such as the exposure light E1 at the section p2, the exposure light E2 at the section p2 and the section p3, and the exposure light E3 at the section p4. The distributions of the exposure lights E1 to E3 are set by the above-mentioned density filters Fj. Further, the exposure lights E1, E2, and E3 are set so that the exposure light E1 and the exposure light E2 are superposed at section p2 and the exposure light E2 and exposure light E3 are superposed at section p4.

Figure 8B:
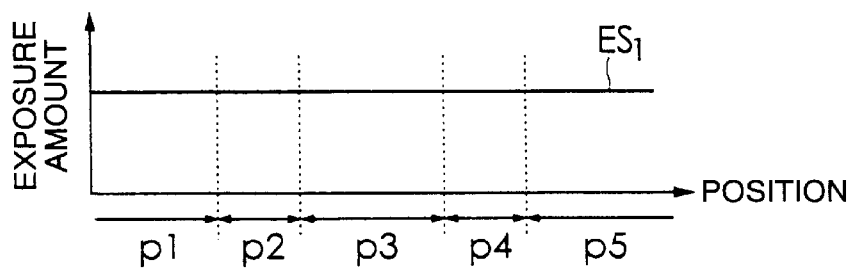
Figure 8C:
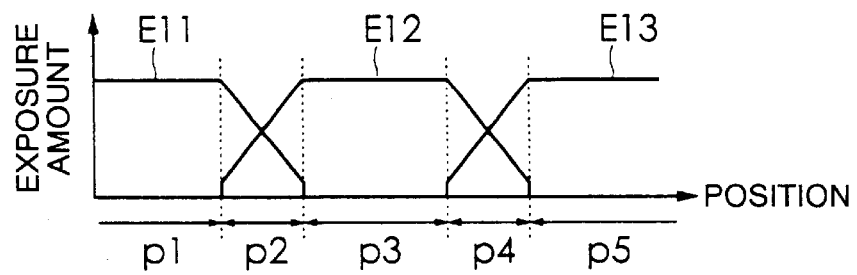
Figure 8D:
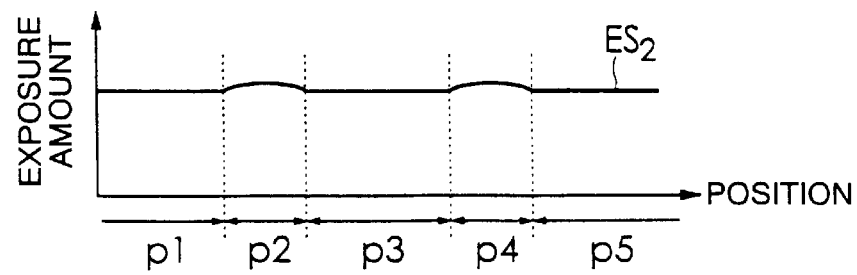

If the exposure lights E1, E2, and E3 are superposed at section p2 and section p3 as designed with the distribution shown in FIG. 8A, the distribution of the total exposure of the sections p2 and p4 forming overlay parts and the distribution of the total exposure of the sections p1, p3, and p5 forming portions other than overlay parts become equal and forms the distribution $ES_1$ shown in FIG. 8B. In actual exposure, however, flare occurs due to the multiple reflection in the projection optical system provided in the exposure apparatus and the multiple reflection between the substrate and the projection optical system, between the substrate and the reticle, and between the reticle and the substrate. If the effect of flare is felt, usually the exposure increases and becomes the exposure light E11, E12, and E13 shown in FIG. 8C. Of the exposure light E1, E2, and E3 shown in FIG. 8A and the exposure light E11, E12, and E13 shown in FIG. 8C, the exposure light E11, E12, and E13 are the exposure light E1, E2, and E3 offset by exactly the amount due to the effect of flare. Here, if flare occurs, the degree of the effect of flare differs between the sections p1, p3, and p5 exposed only once and the sections p2 and p4 exposed two or four times. Therefore, if the exposure light E11, E12, and E13 affected by the flare are superposed, as shown in FIG. 8D, the distribution becomes the distribution $ES_2$ where the exposures of the sections p2 and p4 forming overlay parts where the effects of flare are felt more than other portions increase. In the present embodiment, the distribution of exposure at overlay parts is adjusted to make the distributions of the exposure at sections p2 and p4 equal to the distributions of the exposures at sections p1, p3, and p5. In the example shown in FIG. 8C and FIG. 8D, the explanation is made with reference to the case where the exposure of overlay parts increases due to the effect of flare, but sometimes the exposure of overlay parts becomes smaller than the exposure at portions other than overlay parts. The basic thinking in the present embodiment is to eliminate the increase in the exposure due to the effect of flare in overlay parts by making the exposure at overlay parts smaller than the design value (distribution of exposure light E1, E2, and E3 shown in FIG. 8A) and as a result making the exposure at overlay parts and the exposure at portions other than overlay parts equal.

Figure 9:
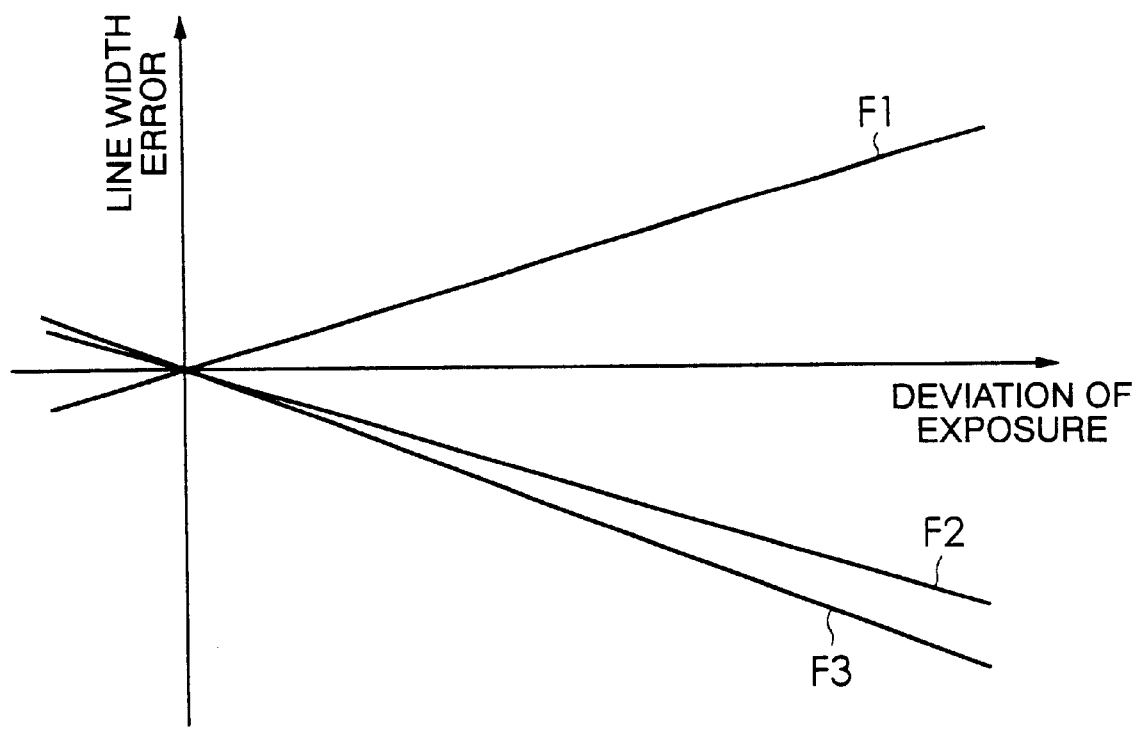
FIG. 9 is a view of the relationship between deviation of exposure from suitable exposure and line width error.

Below, in the present embodiment, the explanation will be made of the method of adjusting the distribution of exposure at overlay parts, but this method of adjustment may be used in general when exposing while stitching. The relationship between the deviation of exposure from the suitable exposure and the error of the line width formed on the substrate 4 is found in advance before adjusting the distribution of exposure. FIG. 9 is a view of an example of the relationship between the deviation of exposure from the suitable exposure and the error of the line width. Here, the suitable exposure is the exposure required for forming patterns of a predetermined line width on the substrate 4. In FIG. 9, the abscissa shows the deviation of exposure from the suitable exposure and the ordinate shows the error of the line width. Further, even if the exposures are the same, the error which arises differs depending on the type of the patterns to be formed (for example, dense patterns and sparse patterns), so the measurement is performed in accordance with the shape of the patterns.

In FIG. 9, the line assigned the reference F1 shows the line width error of the space width when forming sparse space patterns, the line assigned the reference F2 shows the line width error of the line when forming line-and-space patterns, and the line assigned the reference F3 shows the line width error of the line width when forming sparse line patterns. In the example shown in FIG. 9, when the exposure is large, the line width of the line patterns becomes narrower, while the line width of the space patterns becomes broader. The data showing the relationship between the deviation of the exposure and the error of line width obtained in this way is stored in a memory (not shown) provided in the main control system 9. Further, the data showing the relationship between the deviation of the exposure and the error of line width stored in the memory is not constantly used when adjusting the distribution of exposure explained below. It is used when actually exposing the shot areas of the substrate 4 while stitching, then measuring the line width of actually formed patterns and considering the effect of flare.

Next, an explanation will be made of a first method of adjusting the distribution of exposure at overlay parts. FIG. 10 is a flow chart showing the first method of adjustment of the distribution of exposure. Further, the processing shown in FIG. 10, to facilitate understanding, shows only the operation in the case when exposing while stitching two adjoining shot areas among the plurality of shot areas set on the substrate 4. Further, in the first method shown in FIG. 10, the distribution of exposure is adjusted by changing the light-attenuation characteristic of the density filter Fj without changing the relative positions of the density filter Fj, the master reticle Ri, and the substrate 4. Further, here, it is assumed that the filter library 16a is set in advance with a plurality of density filters (density filters having configuration shown in FIG. 2A) Fj having rectangular light-attenuating parts 123 with different light-attenuation characteristics from each other. The explanation will be given assuming that one of these is loaded on the filter stage FS, the positions of the four blinds 111 of the reticle blind mechanism 110 are suitably set, and one or more of the four sides of the light-attenuating part is shielded.

When the exposure processing is started, the main control system 9 determines the overall exposure so that the line width becomes the set line width in accordance with the type and line width of the patterns formed. At this time, the exposure at the time of the exposure performed the first time and the exposure at the time of the exposure performed the second time are equally distributed for overlay parts and the distribution of exposure at overlay parts is theoretically found (step SA1). Further, in the first method, to facilitate understanding, the explanation was given of the case of the distribution of exposure at overlay parts linearly increasing or decreasing but for example the distribution may also be one which changes nonlinearly even with a distribution changing by a secondary function.

Further, the main control system 9 outputs to the slider 18a a control signal for unloading a density filter Fj able to give the distribution of exposure in overlay parts found by that processing from the filter library 16a and loads the density filter Fj to the filter stage FS (step SA2). The marks 124A to 124D or the slit mark 125 of the density filter Fj are measured using for example the above detection device (not shown) or illumination distribution detection sensor 126 (hereinafter called simply the "illumination distribution detection sensor 126"), and the density filter Fj loaded on the filter stage FS is aligned with respect to the master reticle Ri based on the result of measurement.

When the density filter Fj finishes being transported, the main control system 9 drives the substrate stage 6 through the stage control system 10 to make the illumination distribution detection sensor 126 move near the projection position of the projection optical system 3. When the illumination distribution detection sensor 126 finishes being moved, the main control system 9 controls the reticle blind mechanism 110 and the light source 100 to start firing the exposure light IL on the sample table 5. In the state with the exposure light IL fired on the sample table 5, the main control system 9 drives the substrate stage 6 through the stage control system 10 and measures the spatial distribution of exposure light IL fired on the sample table 5 by the illumination distribution detection sensor 126 (step SA3).

When the spatial distribution of exposure light IL finishes being measured, the main control system 9 performs processing to correct the theoretical distribution of exposure set at step SA1 based on the result of measurement of the spatial distribution obtained by the processing at step SA3 (step SA5). This processing is performed to reduce the effect of flare occurring at the time of actual exposure, in particular the effect of flare at overlay parts which are exposed multiple times. That is, at step SA3, the actual distribution of exposure light including flare is measured. Even if flare is included at step SA4, the theoretically set distribution of exposure is corrected so as to become the distribution set at step SA1. Further the corrected distribution of exposure forms the predetermined first distribution.

Next, the main control system 9 outputs to the slider 18a a control signal for unloading a density filter Fj able to give the distribution of exposure corrected at step SA4 from the filter library 16a and transports the density filter Fj to the filter stage FS (step SA5). The marks 124A to 124D or the slit mark 125 of the density filter Fj are measured using the illumination distribution detection sensor 126, and the density filter Fj loaded on the filter stage FS is aligned with respect to the master reticle Ri based on the result of measurement.

When the density filter Fj finishes being transported, the main control system 9 drives the substrate stage 6 through the stage control system 10 to position the shot area to be exposed with respect to the projection position of the projection optical system 3. Next, it drives the corresponding ones of the four blinds 111 of the reticle blind mechanism 110 in accordance with the position of overlay parts of the exposed shot area and shields the light-attenuating parts other than the light-attenuating parts corresponding to overlay parts. For example, if the reticle Ri loaded on the reticle stage 2 is formed with the parent pattern P1 shown in FIG. 6, the corresponding blinds 111 are driven so as to shield the lower side and right side of the four sides of the light-attenuating part 123. Next, the main control system 9 drives the light source 100 to start the firing of the exposure light IL and expose the shot area positioned at the substrate 4 (step SA6).

The exposure in this processing is a distribution of exposure substantially the same as the theoretical amount of distribution found at step SA1 even when flare occurs. When the shot area finishes being exposed, the main control system 9 controls the blind mechanism 110 and the light source 100 to stop firing the exposure light IL and stop the exposure light IL from reaching the substrate 4. From this state, it drives the substrate stage 6 through the stage control system 10 to make the illumination distribution detection sensor 126 move near the projection position of the projection optical system 3.

When the illumination distribution detection sensor 126 finishes being moved, the main control system 9 controls the light source 100 to fire the exposure light IL on the sample table 5. In the state with the exposure light IL fired on the sample table 5, the main control system 9 drives the substrate stage 6 through the stage control system 10 and measures the spatial distribution of exposure light IL fired on the sample table 5 by the illumination distribution detection sensor 126 (step SA7). The spatial distribution of exposure light IL is measured in a direction substantially perpendicular to the related side at a plurality of locations (for example four locations) separated by a predetermined pitch in a direction along the side corresponding to a portion forming an overlay part among the four sides of the shot area. In this embodiment, use is made of the average value of the result of measurement at these positions (in this example, four locations). When the spatial distribution of exposure light IL finishes being measured, the main control system 9 controls the reticle blind mechanism 110 and the light source 100 to stop firing the exposure light IL so that the substrate 4 is not exposed by the exposure light IL again.

Next, the main control system 9 finds the distribution of exposure whereby the exposure at overlay parts becomes equal to the exposure at portions other than overlay parts when further exposed based on the spatial distribution of exposure light IL obtained using the illumination distribution detection sensor 126 (step SA8). Further, this distribution forms the second distribution.

Further, the main control system 9 outputs to the slider 18*a* a control signal for unloading a density filter Fj able to give the distribution of exposure found by this processing from the filter library 16*a* and transports the density filter Fj to the filter stage FS (step SA9). When there is no density filter Fj realizing the required distribution present in the filter library 16*a* at step SA9, this is dealt with by producing a density filter having a light-attenuating part 123 for realizing the required distribution.

Finally, the main control system 9 drives the substrate stage 6 through the stage control system 10 to position the shot area to be exposed next with respect to the projection position of the projection optical system 3. Next, it drives the corresponding ones of the four blinds 111 of the reticle blind mechanism 110 in accordance with the position of overlay parts of the exposed shot area and shields the light-attenuating parts other than the light-attenuating parts corresponding to overlay parts. For example, if the reticle Ri loaded on the reticle stage 2 is formed with the parent pattern P2 shown in FIG. 6, the corresponding blinds 111 are driven so as to shield the right side of the four sides of the light-attenuating part 123. Next, it exposes the positioned shot area with stitching with the shot area exposed at step SA6 (step SA10). In this processing, the positioned shot area is exposed by the distribution set so that the total exposure of overlay parts becomes equal to the exposure of portions other than overlay parts based on the exposure measured at step SA7. Therefore, the total exposure of overlay parts and the exposure of portions other than overlay parts become equal, so as a result it is possible to form patterns whereby the line width of patterns formed at overlay parts and the line width of pattern formed at portions other than overlay parts become equal. Further, in the above explanation of the first method, the explanation was made of only the stitch exposure of two shot areas, but the same applies to stitch exposure of three or more shot areas.

Further, in the processing explained using FIG. 10, the routine comprises finding the distribution of exposure of overlay parts at step SA1 with respect to the shot area to be exposed first, transporting a density filter Fj realizing the distribution of exposure of overlay parts found at step SA1 to the filter stage FS (step SA2), measuring the distribution of exposure without the exposure of the substrate 4 (step SA3), correcting the distribution of exposure based on the result of measurement (step SA5), and exposing the substrate 4 using the filter realizing the corrected distribution of exposure (steps SA6 and SA7).

To increase the throughput, that is, the number of substrates which can be processed in a unit time, a smaller number of processing steps is preferred. Therefore, the processing for measuring only the distribution of exposure without exposing the substrate 4 may be omitted. In this case, the processing of step SA3 to step SA5 in FIG. 10 are omitted and the following processing performed. That is, the first shot area is exposed using a density filter Fj realizing the theoretically set distribution of exposure (steps SA2 and SA6). In this case, the shot area is exposed by exposure affected by flare. Next, the distribution of exposure when exposing the first shot area including the flare is measured (step SA7). The processing for finding the distribution of exposure where the exposure of overlay parts becomes equal to the exposure other than at overlay parts based on the result of measurement (step SA8) is performed, then the adjoining shot area is exposed by stitching using a density filter for realizing this distribution (steps SA9 and SA10). That is, when exposing the first shot area by an exposure greater than the actual exposure in the state with the effect of flare and exposing the shot area adjoining that shot area, a distribution of exposure is found considering the exposure performed by the large exposure previously. Further, in this processing, the distribution set at step SA1 becomes the theoretically set first distribution.

In the above explanation, only the density filter shown in FIG. 2A was used to shield part of the light-attenuating part by the blinds 111 of the reticle blind mechanism 110, but it is also possible to suitably switch and use the density filters F1 to F9 shown in FIG. 3A to FIG. 3I in accordance with the position of the shot area to be exposed. When switching density filters Fj, the marks 124A to 124D or the slit mark

125 of the density filter Fj are measured using the illumination distribution detection sensor 126, and the density filter Fj is aligned with respect to the master reticle Ri based on the result of measurement.

Further, as explained above, when there is no density filter Fj having the light-attenuating characteristic required in the filter library 16a at step SA9, this can be dealt with by producing a density filter provided with a light-attenuating part 123 having a light-attenuating characteristic giving the exposure required. When producing the density filter, the density filter Fj transported on the filter stage FS at step SA5 becomes the test density filter. Further, when the processing of step SA3 to step SA5 of FIG. 10 is omitted, the density filter Fj transported on the filter stage FS at step SA2 becomes the test density filter. Further, a density filter provided with a light-attenuating part 123 having a light-attenuation characteristic is produced based on the distribution of exposure measured using the illumination distribution detection sensor 126.

In addition to this method of production, it is also possible to actually expose while stitching a test substrate, measure the line width of the patterns formed by overlay parts actually superposed, and find the deviation of the exposure at overlay parts using the data showing the relationship between the deviation of the exposure shown in FIG. 9 and the line width error and the result of measurement and thereby measure the distribution of exposure and thus to produce a density filter provided with a light-attenuating part 123 having a light-attenuation characteristic based on the obtained distribution. Further, the light attenuation of the density filter is changed by adjusting the distribution of density of the light-blocking dots formed on the light-blocking part 123 of FIG. 2A.

In the above processing, when measuring the distribution of exposure, use is made of the illumination distribution detection sensor 126. The illumination distribution detection sensor 126 is configured as shown in FIG. 5A. The reflectance of the light-blocking plate 55 with respect to the exposure light IL is set to the same degree as the reflectance of the substrate 4. Therefore, it is possible to set the conditions at the time of measuring the distribution of exposure substantially the same as the conditions by which the substrate 4 is actually exposed, so this is extremely suitable when setting the exposure of overlay parts and the exposure of portions other than overlay parts equal.

Further, when the reflectance of the light-blocking plate 55 provided at the illumination distribution detection sensor 126 cannot be set to be substantially identical to the reflectance of the substrate 4, it is also possible to estimate the effect arising due to the difference between the reflectance of the surface of the light-blocking plate 55 and the reflectance of the substrate 4, for example, the difference in the output of the photoelectric sensor 56, and store it in a memory provided in the main control system 9 and to correct the detected value of the photoelectric sensor 56 to find the distribution of exposure.

Further, it is also possible not to measure the distribution of exposure using the illumination distribution detection sensor 126, but to stitch and expose the shot areas, measure the line width of the patterns formed when overlay parts are actually superposed, and use the data showing the relationship between the deviation of the exposure shown in FIG. 9 and the line width error to find the deviation of the exposure at overlay parts and thereby measure the distribution of exposure. In this case, use is made of a test substrate as the substrate on which the patterns are actually formed.

Further, the method of measuring the line width of the patterns actually formed may measure a latent image formed on a photoresist coated on a substrate or a test substrate and use this for the line width or measure patterns formed when developing the photoresist and use these for the line width. Further, it is possible to measure patterns formed by actually etching or otherwise processing the substrate or test substrate after development and use these for the line width.

In the above explanation, the distribution of exposure for determining the optimal density filter (step SA7) was measured in the actual exposure processing sequence (series of processing for stitching and exposing substrate), but it is also possible to measure the distribution of exposure under similar conditions in advance to identify the optimal density filter Fj and performing processing using the density filter Fj identified in advance without measuring the distribution of exposure during the actual exposure processing sequence. In this case, if there is no density filter having the optimal light-attenuating characteristic, it is also possible to reprocess the density filter Fj measured for the distribution of exposure, then reload it on the filter stage and measure the distribution of exposure again. When reloading the density filter Fj, the marks 124A to 124D or the slit mark 125 of the density filter Fj are measured using the illumination distribution detection sensor 126, and the density filter Fj loaded on the filter stage FS is aligned with respect to the master reticle Ri based on the result of measurement.

Next, an explanation will be given of a second method for adjusting the distribution of exposure at overlay parts where peripheral parts of shot areas are superposed. In the above first method, the distribution of exposure was adjusted by changing the light-attenuation characteristic of the light-attenuating part 123 of the density filter Fj without changing the relative positions of the density filter Fj, master reticle Ri, and substrate 4.

As opposed to this, the second method explained below adjusts the distribution of exposure of overlay parts by changing the relative positions of the density filter Fj, master reticle Ri, and substrate 4. Further, in the second method, the explanation will be given of only the technology for adjusting the exposure of overlay parts. The actual exposure processing sequence is similar to that of the first method explained above, so its explanation will be omitted. Further, in the above first method, the explanation was given assuming that the exposures at overlay parts and portions other than overlay parts are to be matched. Of course the same can be done using the second method, but here the explanation will be given assuming the exposure at overlay parts is to be deliberately made different from the exposure at other than overlay parts.

As cases where it is necessary to deliberately make the exposures of overlay parts and portions other than overlay parts different, mention may be made of the case of considering the change in optical characteristics due to multiple exposure and canceling an amount corresponding to the change by adjusting the exposure at overlay parts. As the change of optical characteristics due to multiple exposure, for example, there is the change in the optical characteristics of the photoresist coated on the substrate 4 itself. That is, a photoresist sometimes changes in transmittance or sensitivity etc. with respect to light when exposed once. In this case, since overlay parts of the shot areas are exposed twice (double exposure), when there is a change in the characteristics of the photoresist due to the first exposure, the same situation arises as when there is an actual change in the exposure of overlay parts by an amount corresponding to the change. Therefore, by adjusting the exposure at overlay parts with respect to the exposure of portions other than overlay parts by exactly an amount corresponding to the change, it is possible to cancel the amount of change.

The amount of change can be found theoretically from the known optical characteristics of the photoresist. Further, the amount of change can be found by actually stitching and exposing the substrate or test substrate to form patterns and measuring the line width of the patterns. The method of measuring the line width may for example measure a latent image formed on a photoresist coated on a substrate or a test substrate and use this for the line width or measure patterns formed when developing the photoresists and use these for the line width. Further, it is possible to measure patterns formed by actually etching or otherwise processing the substrate or test substrate after development and use these for the line width. The specific method for adjusting the exposure corresponding to the amount of change of the optical characteristics found in this way with respect to the exposure of overlay parts is as follows. Further, the second method of course may also be used when desiring to adjust the exposure of overlay parts for other reasons not only when adjusting the exposure corresponding to the amount of change of the optical characteristics due to multiple exposure.

FIG. 11A to FIG. 11C, FIG. 12A to FIG. 12C, FIG. 13A to FIG. 13C, and FIG. 14A to FIG. 14C are views for explaining the second method of adjustment of the distribution of exposure. In these figures, to facilitate understanding, only the blinds, density filter, and master reticle are illustrated. First, FIG. 11A to FIG. 11C will be explained. The figures show a general example of the relative positional relationship of the density filters, blinds, and master reticles—applying to the first method as well.

FIG. 11A is a view of the relative positions between the density filter and master reticle when exposing a first shot area, FIG. 11B is a view of the relative positions between the density filter and master reticle when exposing a second shot area adjoining the first shot area, and FIG. 11C is a view of the distribution of exposure in an area exposed when exposed in the states shown in FIG. 11A and FIG. 11B.

In FIG. 11A to FIG. 11C, members the same as the members shown in FIG. 1 are assigned the same reference numerals. That is, in FIG. 11A and FIG. 11B, F1 and F2 indicate density filters, 111A and 111B blinds, and R1 and R2 master reticles. Further, FIG. 11A and FIG. 11B show the density filters F1 and F2, the blinds 111A and 111B, and the master reticles R1 and R2 centered about the optical axis AX of the projection optical system 3. To facilitate understanding, the optical axis AX is shown straight without bending. Further, in FIG. 1, the blinds 111A and 111B, the density filter Fj, and the reticle Ri are arranged in that order along the optical axis AX, but in FIG. 11A and FIG. 11B, to facilitate understanding, the density filters F1 and F2 and the blinds 111A and 111B are illustrated switched in order of arrangement. Further, to identify the positions of the patterns formed on the master reticles R1 and R2, numbers are assigned corresponding to the positions shown in FIG. 11A to FIG. 11C. Further, when identifying the pattern positions, the explanation is given such as the pattern "1", pattern "2", etc.

First, an explanation will be given of the case of exposure of the first shot area with reference to FIG. 11A. In FIG. 11A, the exposure light IL entering the density filter F1 has a uniform distribution of exposure in the plane vertical to the optical axis AX, but when entering the density filter F1, the light is attenuated at the light-attenuating part 123, so after passing through the density filter F1, becomes the distribution of exposure assigned the reference PF1. Further, when showing the distribution of exposure in FIG. 11A to FIG. 11C, the exposure is shown in the direction parallel to the optical axis AX.

The exposure light passing through the density filter F1 is formed into a predetermined shape by entering the blinds 111A and 111B. In the example shown in FIG. 11A, it is formed into a shape illuminating the pattern "1" to pattern "11" formed on the master reticle R1. When the exposure light passing through the blinds 111A and 111B enters the master reticle R1, an image reflecting the shape of the individual patterns is emitted as shown by the reference Im1. Further, the distribution of exposure of the image Im1 becomes that given the reference PF11. That is, the exposure light passing through the light-transmitting part 122 has a constant distribution of exposure, but the exposure light passing through the light-attenuating part 123 has a distribution of exposure linearly attenuating from the pattern "7" to the pattern "11".

Further, FIG. 11B shows the case of exposing a second shot area. As shown in FIG. 11B, after passing through the density filter F2, the light has the distribution of exposure assigned the reference PF2. Further, in FIG. 11A and FIG. 11B, to facilitate understanding, the distribution of exposure PF1 and the distribution of exposure PF2 are shown as having the same distribution.

The blinds 111A and 111B when exposing the second shot area are arranged at positions different from the blinds 111A and 111B when exposing the first shot area. That is, the blinds 111A and 111B shape the exposure light into a shape illuminating the pattern "7" to the pattern "11" of the master reticle R2.

When the exposure light passing through the blinds 111A and 111B enters the master reticle R2, an image reflecting the shape of the individual patterns is emitted as shown by the reference Im2. Further, the distribution of exposure of the image Im2 becomes that given the reference PF12. That is, the exposure light passing through the light-transmitting part 122 has a constant distribution of exposure, but the exposure light passing through the light-attenuating part 123 has a distribution of exposure linearly attenuating from the pattern "11" to the pattern "7".

The image Im1 shown in FIG. 11A and the image Im2 shown in FIG. 11B are stitched together by the positional relationship shown in FIG. 11C. That is, the images of pattern "7" to pattern "11" are superposed and exposed and transferred to a overlay part (first overlay part). When exposed in this way, the exposure of overlay parts theoretically becomes equal to the exposure of portions other than overlay parts as shown by reference PF13 in FIG. 11C. Further, in FIG. 11C, the distance between the exposure position of the first shot area and the exposure position of the second shot area is called the step pitch SP1. That is, the step pitch SP1 is the distance of movement of the second shot area to the exposure position after exposing the first shot area. In the example shown in FIG. 11A to FIG. 11C, FIG. 12A to FIG. 12C, FIG. 13A to FIG. 13C, and FIG. 14A to FIG. 14C, the step pitch SP1 is set to 12 mm, that is, 21,000 μm.

Further, in this embodiment, an "overlay part" means a portion where peripheral parts of shot areas are superposed on a substrate 4 (first overlay part), a portion where images of light-attenuating parts 123 of a density filter Fj are superposed on a substrate 4 (second overlay part), or a portion where images of patterns of a master reticle are superposed on a substrate 4. In the above explanation, these matched, so were not particularly differentiated. In the following explanation, however, these do not match, so when simply an "overlay part" is referred to, it should be considered to mainly mean a portion where the peripheral parts of the shot area are superposed on the substrate 4. To differentiate from this, a portion where the images of the light-attenuating parts 123 of the density filter Fj are superposed on the substrate 4 is referred to as a "light-attenuating overlay part" while a portion where the images of patterns of the master reticle are superposed on the substrate 4 is referred to as a "pattern image overlay part".

Next, an explanation will be given of a second method of adjustment of the distribution of exposure referring to FIG. 12A to FIG. 12C, FIG. 13A to FIG. 13C, and FIG. 14A to FIG. 14C. The second method explained below is a method of changing the distribution of the energy beam limited by the density filter and the relative position with the patterns to be transferred so as to adjust the exposure at overlay parts where the peripheral parts of shots are superposed. More specifically, by changing the relative positions between the density filter and the master reticle to change the width of the light-attenuating image overlay parts, the exposure at overlay parts is adjusted. In the following explanation, the explanation will be given with reference to the example of the case where the width of overlay parts and the light-attenuating image overlay parts of 1 mm, that is, 1000 μm.

The point that, in this case, if the width of the light-attenuating overlay parts changes by 10 μm, the exposure changes by a rate of 1% should be noted. That is, 100%/1000 μm=1%/10 μm. Further, in the explanation using FIG. 12A to FIG. 12C, FIG. 13A to FIG. 13C, and FIG. 14A to FIG. 14C, the master reticles R1 and R2 are made to move. In this case, the point that the substrate 4 also moves along with movement of the master reticles R1 and R2 should be noted. In this case, the amount of movement of the substrate 4 is 1/β the amount of movement of the master reticles R1 and R2.

FIG. 12A to FIG. 12C are views of an example of the relative positional relationship of the density filters, blinds, and master reticles in the case of reducing the exposure of overlay parts. Further, in the following explanation, for convenience, the explanation is given of the case of not changing the positions of the density filters F1 and F2, but changing the positions of the blinds 111A and 111B and the master reticles R1 and R2 to change the relative positions of the density filters F1 and F2 and the master reticles R1 and R2, but it is also possible not to move the master reticles R1 and R2 and to change the positions of the density filters F1 and F2 to change the relative positions.

Now, when desiring to reduce the exposure at overlay parts by exactly 1%, the width of the light-attenuating overlay part may be reduced by exactly 10 μm. Therefore, when exposing the second shot area on the substrate 4, the substrate 4 is made to move by step motion from the exposure position of the first shot area by exactly 21,000 μm+10 μm=21,010 μm.

Further, as will be understood from a comparison of FIG. 11A and FIG. 12A, the blind 111A and reticle R1 are moved in the direction D1 in FIG. 12A by the amount of one pattern formed on the master reticle R1. Therefore, the pattern "1" of the master reticle R1 is moved to the position of the pattern "2" of the master reticle R1 shown in FIG. 11A. Now, since the case where the width of overlay parts is narrowed by exactly 10 μm is considered, the amount of movement of the master reticle R1 may be made 5 μm converted to movement on the substrate 4. That is, if the reduction rate of the projection optical system is made β, it is sufficient that the overlay part be moved by exactly 5·β μm in a certain direction, that is, the direction D1 in FIG. 12A. In FIG. 12A, by moving only the blind 11A, the illumination area with respect to the master reticle R1 also becomes narrower compared with FIG. 11A. As shown in FIG. 12A, in this case, an image of the pattern "1" to pattern "10" is formed.

After the first shot area is exposed, as mentioned above, the substrate 4 is made to move by exactly 21,010 μm and the second shot area is positioned at the exposure position. Further, the blind 111A and the master reticle R2 are made to move by exactly 5·β μm from the position shown in FIG. 11B to the direction where there is no overlay part, that is, in the direction D2 in FIG. 12B. As shown in FIG. 12B, the image Im4 of the pattern "8" to pattern "17" is formed in this case.

The image Im3 shown in FIG. 12A and the image Im4 shown in FIG. 12B are stitched by the positional relationship shown in FIG. 12C. That is, the images of the pattern "8" to the pattern "10" are exposed at overlay parts. That is, compared with the case where the step pitch SP1 of the substrate 4 is made SP1+SP2=21,000 μm+10 μm=21,010 μm and the master reticles R1 and R2 are shown in FIG. 11A to FIG. 11C, by movement in the direction D1 and the direction D2 for exposure, the exposure at overlay parts is decreased. As shown in FIG. 12C, the distribution of exposure at overlay parts becomes the distribution PF23.

FIG. 13A to FIG. 13C are views of another example of the relative positional relationship of the density filters, blinds, and master reticles in the case of increasing the exposure of overlay parts by increasing the width of the light-attenuating image overlay parts. Further, in the same way as the case of FIG. 12A to FIG. 12C, the relative positions may also be changed by changing the positions of the density filters F1 and F2 without moving the master reticles R1 and R2.

When desiring to make the exposure at overlay parts greater by exactly 1%, it is sufficient to increase the width of overlay parts by exactly 10 μm. Therefore, when exposing the second shot area on the substrate 4, the substrate 4 is stepped from the exposure position of the first shot area by exactly 21,000 μm–10 μm=20,990 μm.

Further, as shown in FIG. 13A, the blind 111A and blind 111B and the master reticle Ri are moved in the direction D3 in the figure by the amount of one pattern formed on the master reticle R1, that is, exactly 5·β μm. In FIG. 13A, since the blind 111A and the blind 111B are moved, the illumination area with respect to the master reticle R1 is the same as the case of FIG. 11A. As shown in FIG. 13A, in this case, the image Im5 of the pattern "1" to pattern "11" is formed.

After the first shot area is exposed, as mentioned above, the substrate 4 is made to move by exactly 20,990 μm and the second shot area is positioned at the exposure position. Further, the blinds 111A and 111B and the master reticle R2 are made to move by exactly 5·β+μm from the position shown in FIG. 11B to the direction where there is no overlay part, that is, in the direction D4 in FIG. 13B. As shown in FIG. 13B, the image Im6 of the pattern "7" to pattern "17" is formed in this case.

The image Im5 and the image Im6 are the same images as the image Im1 and the image Im2 shown in FIG. 11A to FIG. 11C, but the distributions of the exposure and the positions at which the images are formed on the substrate 4 differ. For example, comparing the image Im5 in FIG. 13A and the image Im1 in FIG. 11A, the image Im1 has a constant distribution of exposure from the image of the pattern "1" to the image of the pattern "6", while the image Im5 has a constant distribution of exposure from the image of the pattern "1" to the image of the pattern "7". The location where the distribution of exposure becomes constant is one pattern longer than the case of the image Im1.

Further, the image Im1 is the distribution of exposure linearly attenuating from the image of the pattern "7" to the image of the pattern "11". The exposure smoothly becomes 0 at the end of the image of the pattern "11", while Im5 linearly attenuates from the image of the pattern "8" to the image of the pattern "11". The section having this distribution is shorter by one pattern compared with the image Im1. Further, there is the difference that the exposure sharply becomes 0 from a certain value at the end of the image of the pattern "11".

The image Im5 shown in FIG. 13A and the image Im6 shown in FIG. 13B are stitched together by the positional relationship shown in FIG. 13C. That is, the images of pattern "7" to pattern "11" are exposed at overlay parts. That is, compared with the case where the step pitch SP1 of the substrate 4 is made SP1–SP3=21,000 μm–10 μm=20,990 μm and the master reticles R1 and R2 are shown in FIG. 11A to FIG. 11C, by movement in the direction D3 and the direction D4 for exposure, the exposure at overlay parts is increased.

In FIG. 13C, since the exposure at overlay parts of the distribution PF3 of the image Im5 and the distribution PF32 of the image Im6, the distribution of exposure of overlay parts becomes the distribution PF33.

Further, as shown in FIG. 13A and FIG. 13B, parts of the light-attenuating parts 123 of the density filters F1 and F2 are shielded by the blinds 111A and 111B. This is because there are no patterns at the corresponding portions of the mask. As a result, in FIG. 13C, the width of the light-attenuating image overlay parts appears not to change. When assuming there is no blind 111A, 111B, or other light-blocking object, the width of the light-attenuating image overlay parts changes (enlarges). In the specification of the present application, "the width of a light-attenuating image overlay parts changes (enlarges)" has this meaning. The existence of a light-blocking object present in the optical path of the exposure light (blind or light-blocking belt of mask etc.) is irrelevant.

When increasing the exposure at overlay parts by the method shown in FIG. 13A to FIG. 13C, the distribution of exposure PF31 at the end of the pattern "11" sharply changes as shown in FIG. 13A and the distribution of exposure PF33 at the end of the pattern "7" sharply changes as shown in FIG. 13B. When there is such a sharp change, there is the possibility that the line width of the patterns formed at such a location will also change sharply. Next, the method of solving this problem will be explained.

FIG. 14A to FIG. 14C are views of a modification of the relative positional relationship of the density filters, blinds, and master reticles in the case of increasing the exposure of overlay parts by increasing the width of the light-attenuating image overlay parts. Further, in the same way as FIG. 12A to FIG. 12C and FIG. 13A to FIG. 13C, the relative positions can also be changed by changing the positions of the density filters F1 and F2 without moving the master reticles R1 and R2.

In FIG. 13A, the blind 111A and the blind 111B were made to move together, but in FIG. 14A only the blind 111A is made to move in the direction D3 in the figure. Since the blind 111B is not made to move, an image Im7 including an image of the pattern "12" not able to be obtained at FIG. 13A is obtained. In this case, a distribution of exposure PF41 where the exposure becomes smoothly 0 at the end of the pattern "12" is obtained. Further, in FIG. 13B as well, the blind 111A and the blind 111B were made to move together, but in FIG. 14B, only the blind 111B is made to move in the direction D4 in the figure. Since the blind 111A is not made to move, an image Im8 including an image of the pattern "6" not able to be obtained at FIG. 13B is obtained. In this case, a distribution of exposure PF42 where the exposure becomes smoothly 0 at the end of the pattern "6" is obtained.

The image Im7 shown in FIG. 14A and the image Im8 shown in FIG. 14B are stitched by the positional relationship shown in FIG. 14C. That is, the images of the pattern "6" to the pattern "12" are exposed at the overlay part. That is, the step pitch SP1 of the substrate 4 is SP1–SP3 in the same way as the case of FIG. 13A to FIG. 13C. The amounts of movement of the master reticles R1 and R2 are also similar to the case of FIG. 13A to FIG. 13C. The patterns drawn at the master reticles R1 and R2 are extended or enlarged in the direction where overlay part is present. By not moving the blind 111B in FIG. 14A and moving the blind 111A in FIG. 14B, the width of the overlay part is broadened. In this case, the distribution of exposure at overlay parts becomes the distribution PF43. It changes more gently than the distribution of exposure PF33 of FIG. 14C. A sharp change in the line width can also be suppressed.

Further, it is possible to adjust the exposure of overlay parts using only the above explained second method, but it is also possible to adjust the exposure of overlay parts by using a density filter optimized by the above first method and then by the second method. Further, in FIG. 11A to FIG. 11C, FIG. 12A to FIG. 12C, FIG. 13A to FIG. 13C, and FIG. 14A to FIG. 14C, to facilitate understanding, the explanation was given of the adjustment of the exposure when stitching only two shot areas, but the present invention may also be applied when stitching three or more shot areas and when stitching two-dimensionally. Further, when stitching two-dimensionally, it is preferable to find the optimal supplementary value of the exposure of a one-dimensional stitched portion and two-dimension stitched portion in advance and make corrections by an average value of the optimal correction value or the average value weighted to either the one-dimensional or two-dimensional stitched portion.

Further, with the second method explained above, the relative positions of the density filters F1 and F2, the blinds 111A and 111B, and the master reticles R1 and R2 were changed to adjust the exposure at overlay parts, but this is just one way to realize the technical idea of adjusting the exposure by making exposure light having a certain distribution, formed by a density filter, move relatively with respect to a reticle. Therefore, to realize this technical idea, it is also possible to change the optical characteristics of the optical system from the density filters F1 and F2 to the master reticles R1 and R2, for example, the magnitude, without changing the relative positions of the density filters F1 and F2, the blinds 111A and 111B, and the master reticles R1 and R2. In this case, by changing the magnitude of the combined system comprised of the condenser lens 113, imaging lens system 114, and main condenser lens system 116 arranged between the density filter Fj, the master reticle Ri in FIG. 1, the dimensions of the exposure light shaped by the blind mechanism 110 is changed. In this case, it is possible to make exposure light, for a reticle Ri, having an inclined distribution obtained by passing through a density filter Fj move relative to the master reticle Rj and as a result a similar effect is obtained as the case of making the density filter Fj move relative to the master reticle Ri. Further, in the second method as well, the exposure at overlay parts can be adjusted by selecting and using a density filter with for example a light-attenuating characteristic 1% higher or 1% lower from the density filters stored in the filter library 16*a* shown in FIG. 1.

Further, it is possible to not only improve the line width accuracy of the stitched portions by the adjustment of the exposure of the stitched portions, but also lengthen the exposure time, reduce the effect of vibration of the stage during exposure, and improve the line width accuracy of the stitched portions by use of a low sensitivity resist and reduction of the illumination power.

Next, in the present embodiment, the explanation was given of the case of use of the density filter Fj as the light-attenuating means, but in the above second method, it is also possible to use a means for attenuating light other than a density filter. For example, it is also possible to achieve a function similar to that of a density filter by a blind mechanism BL as shown in FIG. 15. FIG. 15 is a view of another example of a setting device forming an inclined distribution.

The blind mechanism BL basically has a similar configuration to the reticle blind mechanism 110 shown in FIG. 1. It is configured by four movable blinds 127A to 127D and their drive mechanisms (not shown). By setting these four blinds 127A to 127D at suitable positions, a rectangular illumination field is formed at the approximate center of the field of the projection optical system 3.

This illumination field is basically set to a size corresponding to the shot area. By continuously moving one or more of the four blinds 127A to 127D at a predetermined speed to advance into or retract from the optical path of the illumination light, it is possible to set at an incline the amount of transmitted light of the area into which the front edges 128A to 128D of the blinds 127A to 127D have moved.

By comprehensively or selectively moving the blinds 127A to 127D at portions corresponding to the stitched portions of the shots, it is possible to reduce in an incline the exposure at the stitched portions toward the outside. Due to this, a function similar to that of a density filter is realized. This light-attenuating blind mechanism BL is somewhat more complex in configuration compared with a density filter in regard to the need for drive mechanisms for the blinds 127A to 127D, but it is superior in that there is no need to prepare and switch several members in accordance with the shots such as with a density filter and different situations can be flexibly dealt with by a single mechanism.

Further, in the above embodiment, the explanation was given of a reticle exposure apparatus designed to successively stitch and transfer patterns on a blank 4 using a plurality of master reticles Ri, but the invention may be similarly applied to a device exposure apparatus (for example, an exposure apparatus for producing liquid crystal display elements) designed to successively stitch and transfer patterns on a device substrate using a plurality of working masks produced in the above way or produced by another method.

The projection exposure apparatus in the above embodiment was a block exposure type apparatus designed for successive repeated block exposure of shot areas, but the invention may also be applied to a scan exposure type apparatus designed for successive repeated scan exposure of shot areas. In this case, when using a density filter as a light-attenuating means, in the same way as a block exposure type apparatus, it is possible to stitch without restriction as to direction, but when using a blind mechanism as a setting device, it is necessary to specially set the posture of the blinds etc. For example, when stitching in a direction perpendicular to the scan direction, the front edges of the pair of blinds facing the direction perpendicular to the scan direction among the four blinds are made to incline with respect to the scan direction for the scan exposure.

Further, in the above embodiment, the explanation was given of detection of the distribution of intensity of the exposure light IL using an illumination distribution detection sensor 126 having an extremely small aperture 54, but for example it is also possible to use a line sensor or a one-dimensional or two-dimensional CCD etc. to detect the exposure light IL to shorten the time for measurement of the distribution of intensity. Further, in the above embodiment, the explanation was given of provision of the density filter Fj in the illumination optical system, but for example it is also possible to arrange it near the reticle or, when the projection optical system 3 forms an intermediate image (primary image) of the reticle pattern, to arrange it at or near the surface forming the intermediate image. Note that when using a rod integrator (in-plane reflection type integrator) as the optical integrator 106, for example it is also possible to arrange the density filter near the emission face of the rod integrator arranged substantially conjugately with the pattern formation surface of the reticle.

Further, in the above embodiment, the explanation was given of improving the uniformity or control accuracy of the line width etc. of a pattern (transferred image) in individual areas or the entire surface of a plurality of areas when exposing a plurality of areas where peripheral parts are partially superposed on a substrate, but the present invention does not necessarily have to achieve this object. It is also possible to simply improve the control accuracy of the exposure in individual areas or the entire surface of a plurality of areas. That is, it is also possible to just make the distribution of exposure uniform in the individual areas or the entire surface of a plurality of areas or to make the exposure substantially match with corresponding target values (suitable exposures) at different points in individual areas or a plurality of areas. Note that for example the suitable exposure differs according to the position, even on the same substrate, due to uneven coating of the photoresist on the substrate, and the exposure is changed in accordance with the position on the substrate. Therefore, even with a step-and-stitch system which exposes a plurality of areas where peripheral parts are partially superposed on a substrate as in the above embodiment, when the suitable exposure differs depending on the position on the substrate, the exposure may be partially changed in the plurality of areas and the exposure may be made to substantially match with the corresponding suitable exposure at points in a plurality of areas. At this time, it is also possible to make the exposure partially different in a single area or to make the exposure different for each area.

Note that, in the above embodiment, the shot area was made a rectangular shape, but it does not necessarily have to be a rectangular shape. It may also be a pentagon, hexagon, or other polygon in shape. Further, the shot areas do not have to be the same shapes and may be made different shapes or sizes. Further, the portions to be stitched do not have to be rectangular and may be zigzag strips, serpentine strips, and other shapes as well. Further, the "stitching" in the specification of the present application is used in the sense including not only stitching of patterns, but also arrangement of patterns in a desired positional relationship.

It is also possible to enlarge the device pattern to be formed on the working reticle 34, partition the enlarged device pattern into element patterns, partition these into for example dense patterns and sparse patterns, and then form them on the master reticle to thereby eliminate or reduce the stitching portions of parent patterns on the substrate 4. In this case, depending on the device pattern of the working reticle, sometimes the parent pattern of one master reticle is transferred to a plurality of areas on a substrate 4, so the number of master reticles used for production of the working reticle can be reduced. Further, it is also possible to partition the enlarged pattern into functional block units of for example a CPU, DRAM, SRAM, A/D converter, and D/A converter and form one or more functional blocks at a plurality of master reticles.

In the above embodiment, the illumination light for exposure was made ArF excimer laser light of a wavelength of 193 nm, but it is also possible to use higher ultraviolet light, for example, g-rays and i-rays, and KrF excimer laser or other distant ultraviolet (DUV) light, or $F_2$ laser (wavelength 157 nm), $Ar_2$ laser (wavelength 126 nm), and other vacuum ultraviolet (VUV) light. In an exposure apparatus using an $F_2$ laser as a light source, for example a catiodioptic optical system is used as the projection optical system, the refraction optical members used for the illumination optical system or the projection optical system (lens elements) are all made of fluorite, the air in the laser light source, illumination optical system, and projection optical system is for example replaced by helium gas, and the space between the illumination optical system and projection optical system and the space between the projection optical system and the substrate are filled with helium gas.

Further, in an exposure apparatus using an $F_2$ laser, the reticle or density filter used is one made of fluorite, fluorine-doped silica glass, magnesium fluoride, LiF, $LaF_3$, and lithium-calcium-aluminum fluoride (LiCaAlF crystal), or rock crystal.

Further, instead of an excimer laser, it is also possible to use a harmonic of a YAG laser or other solid laser having an oscillation spectrum at any of a wavelength of 248 nm, 193 nm, and 157 nm.

Further, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 nm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used. Further, it is also possible to use light of a soft X-ray region emitted from a laser plasma light source or SOR, for example, EUV (extreme ultraviolet) light of a wavelength of 13.4 nm or 11.5 nm.

The projection optical system is not limited to a reduction system and may also be an equal magnification system or an enlargement system (for example, an exposure apparatus for producing a liquid crystal display or plasma display). Further, the projection optical system may be any of a reflection system, a refraction system, and a catiodioptic system.

Further, the present invention may also be applied to apparatuses other than an exposure apparatus used for the production of a photomask or semiconductor device, such as an exposure apparatus transferring a device pattern on a glass plate used for the production of a display including liquid crystal display elements, an exposure apparatus transferring a device pattern on a ceramic wafer used for production of a thin film magnetic head, an exposure apparatus used for production of a pickup element (CCD), micromachine, DNA chip, etc., and the like. Note that the exposure apparatus to which the present invention is applied need only employ a step-and-stitch system exposing a plurality of areas where peripheral parts are partially superposed on a substrate by energy beams. For example, it is also possible to switch between a step-and-repeat system or a step-and-scan system. That is, in the step-and-stitch system, a density filter may be arranged in the optical path of the exposure light, while in the other systems, a density filter is made to retract outside from the optical path or in addition a field stop separate from the blind 111 may be arranged in the optical path for exposure of the substrate. At this time, it is also possible to also switch the holder holding the substrate. Due to this, it also becomes possible to use the exposure apparatus used for production of a reticle for device production.

In an exposure apparatus used for other than production of a photomask (working reticle), the exposure substrate (device substrate) to which the device pattern is to be transferred is held on the substrate stage 6 by vacuum or electrostatics. In an exposure apparatus using EUV rays, however, a reflection type mask is used, while in a proximity type X ray exposure apparatus or electron beam exposure apparatus etc., a transmission type mask (stencil mask, membrane mask) is used, so a silicon wafer etc. is used as the master of the mask.

The exposure apparatus of the present embodiment may be produced by assembling an illumination optical system comprised of a plurality of lenses and a projection optical system into the body of the exposure apparatus and optically adjusting them, attaching the reticle stage or substrate stage comprised of the large number of mechanical parts to the exposure apparatus body and connecting the wiring and piping, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle by the exposure apparatus of the above embodiment based on the design step, a step of production of a wafer from a silicon material, a step of transferring a pattern of the reticle on to a wafer using an exposure apparatus of the present embodiment, a step of assembly of the device (including dicing, bonding, packaging, etc.), and an inspection step.

The present invention is of course not limited to the above embodiments and may be modified in various ways within the scope of the invention.

According to the present invention, when exposing a plurality of superposed areas, the sensitive object is exposed by an energy having a first distribution, the distribution of exposure of peripheral parts at the time of exposure is measured, and a second distribution where the exposure at the peripheral parts becomes a target value based on the actually measured distribution of exposure is determined, when transferring patterns with equal line width or pitch at overlay parts and portions other than overlay parts, even if there is a flare or the like at the time of exposure, it is possible to make the exposures at overlay parts and portions other than overlay parts equal. Therefore, it is possible to make the line width of patterns formed at overlay parts and the line width of patterns formed at portions other than overlay parts equal and as a result form fine patterns with a good accuracy. That is, when exposing a plurality of areas where peripheral parts are partially superposed on a substrate by an energy beam, it becomes possible to improve the uniformity or control accuracy of the line width etc. of the patterns (transferred image) in individual areas or the entire surface of the plurality of areas. Further, in addition to this effect or alone, there is the effect that it is also possible to improve the control accuracy of the exposure in the individual areas or the entire surface of the plurality of areas.

Further, according to the present invention, when measuring the distribution of the energy or its integrated value, the effect of reflection of the light-blocking plate is eliminated, the distribution of the energy or its integrated value is measured in a state close to the state where a sensitive substrate is actually exposed, or the distribution of exposure is corrected considering the difference of the reflectance at the time of finding the distribution of exposure, so when the suitable exposure is identical between overlay parts and portions other than the same, there is the effect that it is possible to make the exposure of overlay parts equal to the exposure other than at overlay parts by a higher accuracy. That is, when exposing a plurality of areas where peripheral parts are partially superposed on a substrate by an energy beam, the distribution of exposure can be made uniform in individual areas or in the entire surface of the plurality of areas or the exposure can be made to match with a corresponding target value in individual areas or a plurality of areas.

Further, according to the present invention, there is the effect that by just changing the position of the density filter with respect to the mask or by just changing the magnification of the optical system, it is possible to easily adjust the exposure of overlay parts. Further, the effect is also obtained that since only the position of the density filter is changed, no time is required for processing and as a result the throughput can be improved.

The present disclosure relates to subject matter contained in Japanese Patent Application No. 2000-054962, filed on Feb. 29, 2000, and Japanese Patent Application No. 2001-017797, filed on Jan. 26, 2001, the disclosure of which is expressly incorporated herein by reference in its entirety.

What is claimed is:

1. An exposure method of exposing each of a plurality of areas laid to overlap each other on a sensitive object with an energy beam through a setting device to gradually reduce a dose of exposure within an overlapped portion of each exposed area, comprising:

changing, at the time of at least one time exposure of multiple exposures, at least one distribution of exposure of different distributions of exposure on said overlapped portion, in each of which the dose of exposure is gradually reduced and that are determined based on the number of exposures of the multiple exposures of said overlapped portion with said energy beam and correspond to the multiple exposures, respectively, forming said changed at least one distribution of exposure on said overlapped portion, so that an integrated exposed value of said overlapped portion by said multiple exposures becomes a target amount.

2. A method as set forth in claim 1, further comprising measuring said distribution of exposure at portions corresponding to said overlapped portion within an area whereon said energy beam is irradiated, and wherein said at least one distribution of exposure is changed based on said measured distribution of exposure.

3. A method as set forth in claim 1, wherein each of said different distributions of exposure is determined based on a distribution of energy in a predetermined plane at which said sensitive object is arranged, obtained by detecting said energy beam through said setting device, or its integrated value.

4. A method as set forth in claim 2, wherein, in said step of measuring, a detection device is used, the detection device detecting said energy beam through a part of a light-blocking portion which has substantially the same reflectance as the reflectance of the surface of the sensitive object.

5. A method as set forth in claim 2, wherein, in said step of measuring, a detection device is used, the detection device detecting said energy beam through a part of a light-blocking portion whose size is at least the same as the area whereon said energy beam is irradiated.

6. A method as set forth in claim 4, wherein said distribution of exposure is found based on a detected result of said detection device for detecting said energy beam through a part of said light-blocking portion, and information relating to the difference of the reflectance between the light-blocking portion and said sensitive object.

7. A method as set forth in claim 4, wherein said distribution of exposure is found based on a detected result of said detection device for detecting said energy beam through a part of said light-blocking portion, and information relating to the difference of a size between the light-blocking portion and the area whereon said energy beam is irradiated.

8. A method as set forth in claim 2, wherein said at least one of the distributions of exposure is determined considering also a change in optical characteristics on said overlapped portion due to said multiple exposures.

9. A method as set forth in claim 2, wherein said setting device includes a density filter having an attenuating part for gradually attenuating the intensity of the energy beam to provide said different distribution of exposure, and adjusts the attenuation characteristics of the attenuating part to form said distribution of exposure, which is changed at the time of at least one time exposure, on said overlapped portion.

10. A method as set forth in claim 2, further comprising multiply exposing a sensitive object by said energy beam and measuring the distribution of exposure.

11. A method as set forth in claim 2, wherein said setting device includes a density filter having an attenuating part gradually reducing the energy of the energy beam to provide said different distribution of exposure, and adjusts the optical relative position between the patterns to be transferred on said sensitive object and said density filter to form said distribution of exposure, which is changed at the time of at least one time exposure, on said overlapped portion.

12. A method as set forth in claim 11, wherein attenuation characteristics of said attenuating part of said density filter are determined based on said changed distribution of exposure.

13. A method as set forth in claim 2, wherein said setting device includes a density filter having an attenuating part gradually reducing the energy of the energy beam to provide said different distribution of exposure, and adjusts the optical characteristics of an optical system arranged between the patterns to be transferred on said sensitive object and said density filter to form said distribution of exposure, which is changed at the time of at least one time exposure, on said overlapped portion.

14. A method as set forth in claim 13, wherein the attenuation characteristics of said attenuating part of said density filter are determined based on said changed distribution of exposure.

15. An exposure method of exposing each of a plurality of areas laid to overlap each other on a sensitive object with an energy beam through a setting device to gradually reduce a dose of exposure within an overlapped portion of each exposed area, comprising:
   irradiating said energy beam through said setting device onto a predetermined plane at which said sensitive object is arranged;
   detecting said energy beam, by a detection device having a light-blocking portion, whose reflectance is substantially the same as the reflectance of the surface of said sensitive object, arranged on said predetermined plane, through part of the light-blocking portion; and
   finding a distribution of exposure in which the dose of exposure is gradually reduced on said predetermined plane based on a detected result of said detection device.

16. A method as set forth in claim 15, wherein said distribution of exposure on said overlapped portion is determined based on said found distribution of exposure and information relating to a change in optical characteristics due to multiple exposures of said over lapped portion.

17. An exposure method of exposing each of a plurality of areas laid to overlap each other on a sensitive object with an energy beam through a setting device to gradually reduce a dose of exposure within an overlapped portion of each exposed area, comprising:
   irradiating said energy beam through said setting device onto a predetermined plane at which said sensitive object is arranged;
   detecting said energy beam, by a detection device having a light-blocking portion, whose size is at least the same as the area whereon said energy beam is irradiated, arranged on said predetermined plane, through the part of the light-blocking portion; and
   finding a distribution of exposure in which the dose of exposure is gradually reduced on said predetermined plane based on a detected result of said detection device.

18. A method as set forth in claim 17, wherein said distribution of exposure on said overlapped portion is determined based on said found distribution of exposure and information relating to a change in optical characteristics due to said multiple exposures of said overlapped portion.

19. An exposure method of exposing each of a plurality of areas laid to overlap each other on a sensitive object with an energy beam through a setting device to gradually reduce a dose of exposure within an overlapped portion of each exposed area, comprising:
   irradiating said energy beam through said setting device onto a predetermined plane at which said sensitive object is arranged;
   detecting said energy beam, by a detection device having a light-blocking portion arranged on said predetermined plane, through part of the light-blocking portion; and
   finding a distribution of exposure in which the dose of exposure is gradually reduced on said predetermined plane based on a detected result of said energy beam and information relating to the difference between the reflectance at said light-blocking portion and the reflectance of said sensitive object.

20. A method as set forth in claim 19, further comprising correcting the detected result of said detection device based on the information relating to said difference of the reflectances to find the distribution of exposure.

21. An exposure method of exposing each of a plurality of areas laid to overlap each other on a sensitive object with an energy beam through a setting device to gradually reduce a dose of exposure within an overlapped portion of each exposed area, comprising:
   irradiating said energy beam through said setting device onto a predetermined plane at which said sensitive object is arranged;
   detecting said energy beam, by a detection device having a light-blocking portion arranged on said predetermined plane, through a part of the light-blocking portion; and
   finding a distribution of exposure in which the dose of exposure is gradually reduced on said predetermined plane based on a detected result of said energy beam and information relating to the difference between the size of said light-blocking portion and the size of the area whereon said energy beam is irradiated.

22. A method as set forth in claim 21, further comprising correcting the detected result of said detection device based on the information relating to said difference of the size to find the distribution of exposure.

23. An exposure method of exposing each of a plurality of areas laid to overlap each other on a sensitive object with an energy beam through a setting device to gradually reduce a dose of exposure within an overlapped portion of each exposed area, comprising:
   irradiating said energy beam through said setting device onto said sensitive object to expose the area of the sensitive object multiple times, so that a distribution of exposure, in which the dose of exposure is gradually reduced, is formed at every exposure of the multiple exposures on the exposed area;
   detecting the pattern formed on the exposed area by said multiple exposures; detecting patterns formed on said exposed areas by said multiple exposures; and
   determining the distribution of exposure in which the dose of exposure is gradually reduced on said overlapped portion of each of the areas, based on said detected result so that the shapes of the patterns formed on said overlapped portion by the exposure onto the areas become target values.

24. An exposure method of exposing each of a plurality of areas laid to overlap each other on a sensitive object with an energy beam through a setting device to gradually reduce a dose of exposure within an overlapped portion of each exposed area, comprising:

providing said setting device with a density filter having an attenuating part gradually reducing the energy of the energy beam;

multiply exposing said overlapped portion by the energy beam from said attenuating part; and adjusting the relative position between the energy beam irradiated from said density filter and a pattern to be transferred on said sensitive object at the time of at least one time exposure of said multiple exposures to control the integrated dose of exposures on the overlapped portion by said multiple exposures.

25. A method as set forth in claim 24, wherein patterns obtained by enlarging patterns to be transferred in the direction of the overlapped portion are used at the time of at least one time exposure.

26. A method as set forth in claim 24, wherein a position of said density filter is changed to adjust the relative position between said energy beam and said pattern.

27. A method as set forth in claim 24, wherein the optical characteristics of an optical system are arranged between said density filter and said pattern to adjust the relative position between said energy beam and said pattern.

28. A method as set forth in claim 24, wherein a width of an irradiated portion, whereon the energy beams from said attenuating part are irradiated to overlap each other at said multiple exposure, on said sensitive object, is changed without any change of a width of said overlapped portion by adjusting the relative position between said energy beam and said pattern, so as to make the width of the irradiated portion different from the width of said overlapped portion.

29. A method as set forth in claim 28, wherein the width of said irradiated portion is set less than the width of said overlapped portion.

30. An exposure method of exposing each of a plurality of areas laid to overlap each other on a sensitive object with an energy beam through a setting device to gradually reduce a dose of exposure within an overlapped portion of each exposed area, comprising:

providing said setting device with a density filter having an attenuating part gradually reducing the energy of the energy beam;

multiply exposing said overlapped portion by the energy beam from said attenuating part; and adjusting the optical characteristics of an optical system arranged between said density filter and said patterns at the time of at least one time exposure of said multiple exposures to control the integrated dose of exposures on the overlapped portion by said multiple exposures.

31. A method as set forth in claim 30, wherein a width of an irradiated portion, whereon the energy beams from said attenuating part are irradiated to overlap each other at said multiple exposure, on said sensitive object, is changed without any change of a width of said overlapped portion by adjusting the optical characteristics of said optical system, so as to make the width of the irradiated portion different from the width of said overlapped portion.

32. An exposure method of exposing each of a plurality of areas laid to overlap each other on a sensitive object with an energy beam through a setting device to gradually reduce a dose of exposure within an overlapped portion of each exposed area, comprising:

providing said setting device with a plurality of density filters having different attenuating characteristics of attenuating parts gradually reducing the energy of the energy beam;

multiply exposing said overlapped portion by the energy beam from said attenuating part; and switching the density filters at the time of at least one time exposure of said multiple exposures to control the integrated dose of exposures on the overlapped portion by said multiple exposures.

33. An exposure method of exposing each of a plurality of areas laid to overlap each other on a sensitive object with an energy beam through a setting device to gradually reduce a dose of exposure within an overlapped portion of each exposed area, comprising:

multiply exposing said overlapped portion by said energy beam, and determining the distribution of exposure, in which the dose of exposure is gradually reduced at the time of at least one time exposure of said multiple exposures, based on information relating to a change in optical characteristics of said overlapped portion due to said multiple exposures to control an integrated dose of exposures on the overlapped portion by said multiple exposures.

34. A method as set forth in claim 33, wherein said setting device includes a density filter having an attenuating part gradually reducing the energy of the energy beam, and a relative position between the energy beam irradiated from said density filter and the pattern to be transferred on said sensitive object is adjusted based on the determined distribution of exposure.

35. A method as set forth in claim 33, wherein said setting device includes a density filter having an attenuating part gradually reducing the energy of the energy beam, and the optical characteristics of the optical system arranged between the density filter and the pattern are adjusted based on the determined distribution of exposure.

36. An exposure method of exposing each of areas laid to overlap each other on a sensitive object with an energy beam through a setting device to gradually reduce a dose of exposure within an overlapped portion of each exposed area, comprising:

multiply exposing said overlapped portion by said energy beam so that different distributions of exposures, in each of which a dose of exposure corresponding to each exposure of the multiple exposures is gradually reduced, overlap each other on said sensitive object; and changing a width of a portion that said different distributions of exposures overlap each other on said sensitive object, to make the width different from the width of the overlapped portion without any change of the width of the overlapped portion, so as to control the integrated dose of exposures of said multiple exposures within said overlapped portion.

37. A method as set forth in claim 36, wherein the width of said portion is changed based on information relating to the change of the optical characteristics of said overlapped portion by said multiple exposures.

38. A photomask produced using the method of exposure set forth in claim 1.

* * * * *